(12) United States Patent
Yu et al.

(10) Patent No.: US 8,278,976 B2
(45) Date of Patent: Oct. 2, 2012

(54) METHODS AND DEVICES FOR GENERATING TRAPEZOIDAL FIRE PULSES

(75) Inventors: Jiunguo Yu, Beijing (CN); Feng Chen, Beijing (CN); Zhihong Liu, Beijing (CN)

(73) Assignees: Peking University Founder Group Co., Ltd., Beijing (CN); Peking University, Beijing (CN); Beijing Founder Electronics Co., Ltd., Beijing (CN)

( * ) Notice: Subject to any disclaimer, the term of this patent is extended or adjusted under 35 U.S.C. 154(b) by 137 days.

(21) Appl. No.: 12/935,508

(22) PCT Filed: Mar. 31, 2009

(86) PCT No.: PCT/CN2009/071118
§ 371 (c)(1),
(2), (4) Date: Dec. 27, 2010

(87) PCT Pub. No.: WO2009/121296
PCT Pub. Date: Oct. 8, 2009

(65) Prior Publication Data
US 2011/0084739 A1  Apr. 14, 2011

(30) Foreign Application Priority Data
Mar. 31, 2008 (CN) .......................... 2008 1 0103151

(51) Int. Cl.
*H03K 4/94* (2006.01)
(52) U.S. Cl. ....................................................... 327/130
(58) Field of Classification Search .................... 327/130
See application file for complete search history.

(56) References Cited

U.S. PATENT DOCUMENTS
8,203,296 B2 * 6/2012 Hristov et al. ........... 318/400.19

FOREIGN PATENT DOCUMENTS
CN 201017236 Y 2/2008
CN 101257291 A 9/2008
JP 10146971 A 6/1998

* cited by examiner

*Primary Examiner* — Lincoln Donovan
*Assistant Examiner* — William Hernandez
(74) *Attorney, Agent, or Firm* — The Webb Law Firm

(57) ABSTRACT

The present application discloses trapezoidal fire pulse generating methods and devices. According to the devices and methods of the present application, the voltage value of the positive DC control voltage signal, the voltage value of the negative DC control voltage signal, the voltage value of the rise-time DC control voltage signal and a fall-time DC control voltage signal can be determined according to the parameter values of a trapezoidal fire pulse required to be output. Thus, corresponding DC control voltage signals can be generated. Further, the positive DC control voltage signal and the negative DC control voltage signal can be modulated to a square-wave pulse. Then, the rise-time DC control voltage signal, the fall-time DC control voltage signal and the square-wave pulse can be input to a inverse integrator so as to generate a trapezoidal fire pulse. Since there are specific quantitative relations between the rise time and fall time of the trapezoidal fire pulse and the voltage values of the rise-time and fall-time DC control voltage signals, the corresponding rise time and fall time of the trapezoidal fire pulses can be accurately controlled and adjusted so that the output trapezoidal fire pulses can be more stable and accurate.

21 Claims, 8 Drawing Sheets

METHODS AND DEVICES FOR GENERATING TRAPEZOIDAL FIRE PULSES

FIELD OF THE INVENTION

The present invention relates to the technical filed of waveform generation, and more particularly, to the methods and devices for generating trapezoidal fire pulses.

BACKGROUND OF THE INVENTION

At present, piezoelectric inkjet print heads are widely used. The print head module of an ordinary piezoelectric inkjet print head is a piezoelectric device. Each of the nozzles of the print head is driven by a sheet of piezoelectric ceramic plate. When a voltage of the fire pulse is applied to a corresponding piezoelectric ceramic plate in a certain controlled switching rate, the piezoelectric ceramic plate is energized to offset outward so as to form a negative pressure wave so that ink is drawn into a chamber. After undergoing a constant duration of pulses, the voltage of the fire pulse is removed in a certain controlled switching rate. Since the wall of the chamber is expandable and shrinkable, the total positive pressure waves propagate forwardly to cause the nozzle to jet ink droplets.

The voltage wave of the fire pulse applied to the actuation member of the piezoelectric ceramic plate to induce deformation thereof is slightly different from one type of a nozzle to another. A typical voltage wave of the trapezoidal fire pulse is shown in FIG. 1. The trapezoidal fire pulse can be characterized by four parameters: a fire pulse amplitude (FPA), a fire pulse width (FPW), a rise time (RT) and a fall time (FT). All of the four parameters of the trapezoidal fire pulse may influence the initial velocity and volume of the jetted ink droplet as well as the uniformity of all ink droplets, ultimately influencing the printing quality.

To obtain optimum printing effects, different voltage wave of the trapezoidal fire pulse are required for different print heads, ink and printing materials. Thus, the parameters of the output fire pulse are required to be flexibly adjustable by the device for generating the fire pulse to drive the piezoelectric inkjet print. That is, the fire pulse amplitude, the fire pulse width, the rise time and the fall time of the voltage waveform of the generated trapezoidal fire pulse can be set in real time. In the meanwhile, the device for generating the fire pulse should be as simple as possible in structure while maintaining a high accuracy.

A device for generating the fire pulse generally used in the conventional system for controlling a print head is shown in FIG. 2. In FIG. 2, a voltage regulator is controlled by a pulse amplitude control signal to generate a high voltage DC signal V+ having the amplitude of a fire pulse required to be output. Then, the signal V+ is switched by a half bridge converting circuit so that a fire pulse constituted by the signal V+ and an earth voltage is output. Thus, a voltage waveform signal of the fire pulse is generated to drive the print head. The amplitude parameter of the generated fire pulse can be flexibly adjusted by the device for generating the fire pulse as shown. However, the rise and fall times of the generated fire pulse are determined by the output impedance and the equivalent capacitance of the load of the device for generating the fire pulse together. Such a structure of the device for generating the fire pulse results in a fluctuation of the generated fire pulse waveform due to different loads, and therefore has some influence on the final printing quality.

SUMMARY OF THE INVENTION

There is a problem exists in the conventional trapezoidal fire pulses generating device that the rise time and the fall time of the pulses may change due to load variations of the device, which results in the fluctuation of the voltage waveform of the generated fire pulse. This ultimately influences the printing quality of an inkjet print head. The present invention provides devices and methods for generating trapezoidal fire pulses to solve the above problem existing in the conventional trapezoidal fire pulses generating device.

The present invention provides a trapezoidal fire pulse generating device, comprising a first single-chip microcomputer control unit, a positive voltage output dual-channel DAC unit, a negative voltage output dual-channel DAC unit, a first analog switching unit and a first trapezoidal wave generating unit.

The first single-chip microcomputer control unit is configured to determine the voltage value of the negative DC control voltage signal according to the pulse amplitude parameter value of the trapezoidal fire pulse required to be output, and sets the voltage value of the positive DC control voltage signal to be zero; or determine the voltage value of the positive DC control voltage signal according to the pulse amplitude parameter value of the trapezoidal fire pulse required to be output, and set the voltage value of the negative DC control voltage signal to be zero.

The first single-chip microcomputer control unit is further configured to determine the voltage value of the rise-time DC control voltage signal according to the rise time parameter value of the trapezoidal fire pulse required to be output and the voltage value of the negative DC control voltage signal when the voltage value of the positive DC control voltage signal is zero; or determine the voltage value of the rise-time DC control voltage signal according to the rise time parameter value of the trapezoidal fire pulse required to be output and the voltage value of the positive DC control voltage signal when the voltage value of the negative DC control voltage signal is zero.

The first single-chip microcomputer control unit is further configured to determine the voltage value of the fall-time DC control voltage signal according to the fall time parameter value of the trapezoidal fire pulse required to be output and the voltage value of the negative DC control voltage signal when the voltage value of the positive DC control voltage signal is zero; or determine the voltage value of the fall-time DC control voltage signal according to the fall time parameter value of the trapezoidal fire pulse required to be output and the voltage value of the positive DC control voltage signal when the voltage value of the negative DC control voltage signal is zero.

The first single-chip microcomputer control unit is further configured to generate corresponding digital signals according to the determined voltage value of the positive DC control voltage signal and the voltage value of the fall-time DC control voltage signal and output the digital signals to the positive voltage output dual-channel DAC unit.

The first single-chip microcomputer control unit is further configured to generate corresponding digital signals according to the determined voltage value of the negative DC control voltage signal and the voltage value of the rise-time DC control voltage signal, output the digital signals to the negative voltage output dual-channel DAC unit, generate a pulse width control signal in a square-wave or rectangular-wave pulse form and output the pulse width control signal to the first analog switching unit.

The positive voltage output dual-channel DAC unit is configured to convert the received digital signals to a corresponding positive DC control voltage signal and a corresponding fall-time DC control voltage signal, output the positive DC control voltage signal to first analog switching unit and output the fall-time DC control voltage signal to the first trapezoidal wave generating unit.

The negative voltage output dual-channel DAC unit is configured to convert the received digital signals to a corresponding negative DC control voltage signal and a corresponding rise-time DC control voltage signal, output the negative DC control voltage signal to first analog switching unit and output the rise-time DC control voltage signal to the first trapezoidal wave generating unit.

The first analog switching unit is configured to modulate the positive and negative DC control voltage signals to corresponding square-wave pulses according to the input pulse width control signal, and output the square-wave pulses to the first trapezoidal wave generating unit.

The first trapezoidal wave generating unit is configured to generate a trapezoidal fire pulse according to the fall-time DC control voltage signal, the rise-time DC control voltage signal and the square-wave pulses and output the trapezoidal fire pulse.

The present invention also provides another trapezoidal fire pulse generating device, comprising a second single-chip microcomputer control unit, a positive voltage output dual-channel DAC unit, a negative voltage output dual-channel DAC unit, a second analog switching unit and a second trapezoidal wave generating unit.

The second single-chip microcomputer control unit is configured to perform the following steps:

determining voltage values of positive and negative DC control voltage signals according to pulse amplitude parameter values of the positive and negative trapezoidal fire pulses required to be output, determining a voltage value of fall-time DC control voltage signal according to a first fall time parameter value of the positive and negative trapezoidal fire pulses required to be output and the voltage value of the positive DC control voltage signal; or determining a voltage value of fall-time DC control voltage signal according to a second fall time parameter value of the positive and negative trapezoidal fire pulses required to be output and the voltage value of the negative DC control voltage signal, determining a voltage value of a rise-time DC control voltage signal according to a rise time parameter value of the positive and negative trapezoidal fire pulses required to be output and the voltage values of the positive and negative DC control voltage signals, generating a corresponding digital signal according to the determined voltage value of the positive DC control voltage signal and the determined voltage value of the fall-time DC control voltage signal, and inputting the digital signal to the positive voltage output dual-channel DAC unit, generating a corresponding digital signal according to the determined voltage value of the negative DC control voltage signal and the determined voltage value of the rise-time DC control voltage signal, and inputting the digital signal to the negative voltage output dual-channel DAC unit, and generating a first pulse width control signal and a second pulse width control signal which are both in a form of a square-wave or rectangular-wave pulse and inputting the same to the second analog switching unit, The positive voltage output dual-channel DAC unit is configured to convert the received digital signal to a corresponding positive DC control voltage signal and a fall-time DC control voltage signal, input the positive DC control voltage signal to the second analog switching unit, and input the fall-time DC control voltage signal to the second trapezoidal wave generating unit.

The negative voltage output dual-channel DAC unit is configured to convert the received digital signal to a corresponding negative DC control voltage signal and a rise-time DC control voltage signal, input the positive DC control voltage signal to the second analog switching unit, and input the rise-time DC control voltage signal to the second trapezoidal wave generating unit.

The second analog switching unit is configured to modulate the positive and negative DC control voltage signals and a zero voltage signal to corresponding positive and negative square-wave pulses according to the input first and second pulse width control signals, and output the square-wave pulses to the second trapezoidal wave generating unit.

The second trapezoidal wave generating unit is configured to generate and output positive and negative trapezoidal fire pulses according to the fall-time DC control voltage signal, the rise-time DC control voltage signal and the square-wave pulses.

The present invention provides a method for generating trapezoidal fire pulses, comprising:

determining the voltage value of the negative DC control voltage signal according to a pulse amplitude parameter value of the trapezoidal fire pulse required to be output, and setting the voltage value of the positive DC control voltage signal to be zero; or determining the voltage value of the positive DC control voltage signal according to a pulse amplitude parameter value of the trapezoidal fire pulse required to be output and setting the voltage value of the negative DC control voltage signal to be zero;

when the voltage value of the positive DC control voltage signal is zero, determining the voltage value of the rise-time DC control voltage signal according to the rise time parameter value of the trapezoidal fire pulse required to be output and the voltage value of the negative DC control voltage signal, and determining the voltage value of the fall-time DC control voltage signal according to the fall time parameter value of the trapezoidal fire pulse required to be output and the voltage value of the negative DC control voltage signal; or when the voltage value of the negative DC control voltage signal is zero, determining the voltage value of the rise-time DC control voltage signal according to the rise time parameter value of the trapezoidal fire pulse required to be output and the voltage value of the positive DC control voltage signal, and determining the voltage value of the fall-time DC control voltage signal according to the fall time parameter value of the trapezoidal fire pulse required to be output and the voltage value of the positive DC control voltage signal;

generating corresponding DC control voltage signals according to the determined voltage values of positive and negative DC control voltage signals, the voltage value of the rise-time DC control voltage signal and the voltage value of the fall-time DC control voltage signal;

modulating the positive and negative DC control voltage signals to corresponding square-wave pulses by using a pulse width control signal in a square-wave or rectangular-wave pulse form; and inputting the rise-time DC control voltage signal, the fall-time DC control voltage signal and the square-wave pulses to a reverse integrator with a feedback loop constituted by a dual differential amplifying circuit so as to generate a trapezoidal fire pulse and output the same.

The following beneficial effects may be obtained by the present invention.

According to the devices and methods for generating trapezoidal fire pulses of the present application, voltage values of positive and negative DC control voltage signals, and voltage values of the rise-time and fall-time DC control voltage signals can be determined according to parameter values of the trapezoidal fire pulse required to be output. Thus, corresponding DC control voltage signals can be generated from the determined voltage values. Further, the positive and negative DC control voltage signals can be modulated to respective square-wave pulses by using a pulse width control signal in a square-wave or rectangular-wave pulse form. Then, the rise-time and fall-time DC control voltage signals and the square-wave pulses can be input to a reverse integrator with a feedback loop constituted by a dual differential amplifying circuit so as to generate trapezoidal fire pulses and output the same. Since there are specific quantitative relations between the rise time and fall time of the trapezoidal fire pulses and the voltage values of the rise-time and fall-time DC control voltage signals, the corresponding rise time and fall time of the output trapezoidal fire pulses can be accurately controlled and adjusted by accurately controlling and adjusting the voltage values of the rise-time and fall-time DC control voltage signals. Thus, the output trapezoidal fire pulses become more stable and accurate so as to avoid the problem existing in the conventional trapezoidal fire pulses generating device that the waveform of the output trapezoidal fire pulse has fluctuation due to load variations. Furthermore, different types of trapezoidal fire pulses can be generated and output according to different input square-wave pulse signals so as to meet the requirements of different types of inkjet print heads.

DESCRIPTION OF THE PREFERRED EMBODIMENTS

Hereinafter, the method and device for generating trapezoidal fire pulses provided by the present invention are described in detail by specific embodiments.

First Embodiment

Figure 1:
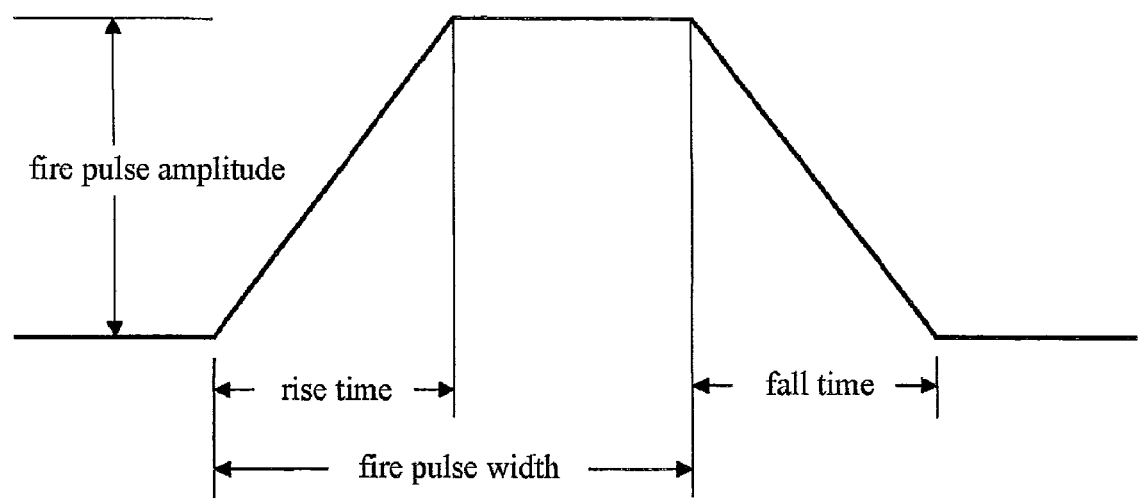
FIG. 1 is a diagram showing waveform of a typical trapezoidal fire pulse in the prior art.
Figure 2:
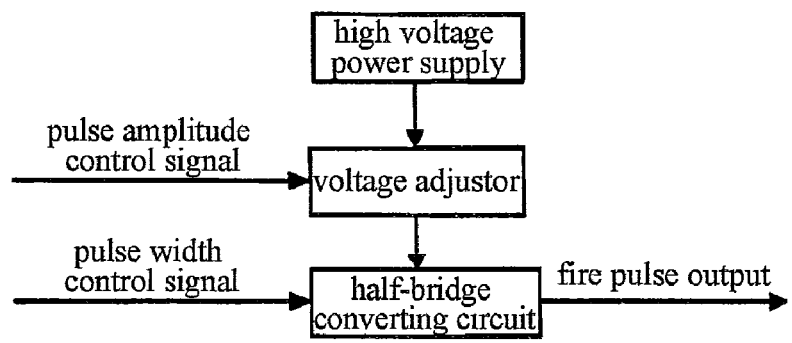
FIG. 2 is a schematic structure diagram showing a fire pulse generating system in the prior art.
Figure 3:
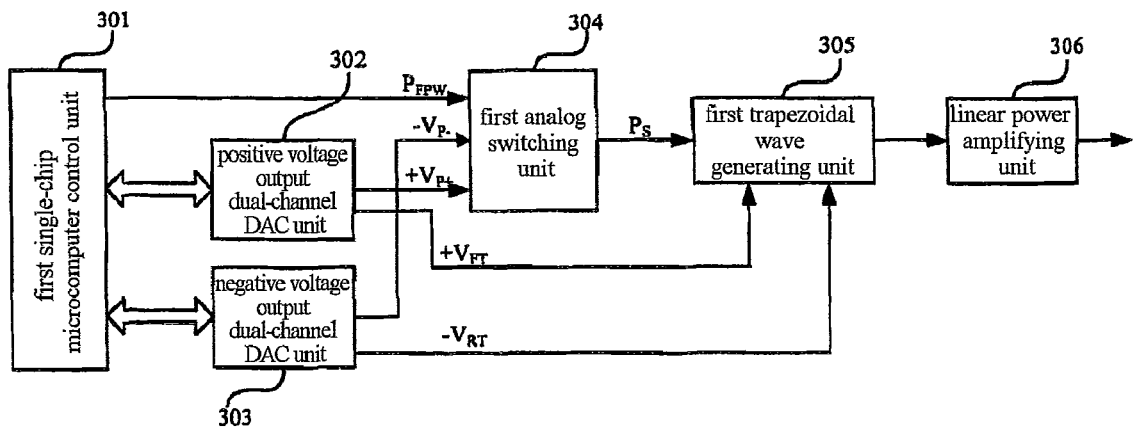
FIG. 3 is a structure diagram showing a trapezoidal fire pulse generating device according to a first embodiment of the present invention.

In the first embodiment of the present invention, a trapezoidal fire pulse generating device is provided. As shown in FIG. 3, the trapezoidal fire pulse generating device comprises a first single-chip microcomputer control unit 301, a positive voltage output dual-channel DAC unit 302, a negative voltage output dual-channel DAC unit 303, a first analog switching unit 304 and a first trapezoidal wave generating unit 305.

The first single-chip microcomputer control unit 301 is configured to determine a voltage value of a negative DC control voltage signal according to a pulse amplitude parameter value of the trapezoidal fire pulse required to be output, and set a voltage value of a positive DC control voltage signal to be zero; or determine the voltage value of the positive DC control voltage signal according to the pulse amplitude parameter value of the trapezoidal fire pulse required to be output, and set the voltage value of the negative DC control voltage signal to be zero.

The first single-chip microcomputer control unit 301 is further configured to determine the voltage value of a rise-time DC control voltage signal according to a rise time parameter value of the trapezoidal fire pulse required to be output and the voltage value of the negative DC control voltage signal when the voltage value of the positive DC control voltage signal is zero; or determine the voltage value of the rise-time DC control voltage signal according to the rise time parameter value of the trapezoidal fire pulse required to be output and the voltage value of the positive DC control voltage signal when the voltage value of the negative DC control voltage signal is zero.

The first single-chip microcomputer control unit 301 is further configured to determine the voltage value of a fall-time DC control voltage signal according to a fall time parameter value of the trapezoidal fire pulse required to be output and the voltage value of the negative DC control voltage signal when the voltage value of the positive DC control voltage signal is zero; or determine the voltage value of the fall-time DC control voltage signal according to the fall time parameter value of the trapezoidal fire pulse and the voltage value of the positive DC control voltage signal when the voltage value of the negative DC control voltage signal is zero.

The first single-chip microcomputer control unit 301 is further configured to generate corresponding digital signals according to the voltage values of the determined positive DC control voltage signal and fall-time DC control voltage signal, and then output the digital signals to the positive voltage output dual-channel DAC unit 302.

The first single-chip microcomputer control unit 301 is further configured to generate corresponding digital signals according to the voltage values of the determined negative DC control voltage signal and rise-time DC control voltage signal, and then output the digital signals to the negative voltage output dual-channel DAC units 303.

The first single-chip microcomputer control unit 301 is further configured to generate a pulse width control signal in square-wave or rectangular-wave pulse form, and then output the pulse width control signal to the first analog switching unit 304.

The positive voltage output dual-channel DAC unit 302 is configured to convert the received digital signals into corresponding positive DC control voltage signal and fall-time DC control voltage signal, and output the positive DC control voltage signal and the fall-time DC control voltage signal to the first analog switching unit 304 and the first trapezoidal wave generating unit 305, respectively.

The negative voltage output dual-channel DAC unit 303 is configured to convert the received digital signals into corresponding negative DC control voltage signal and rise-time DC control voltage signal, and output the negative DC control voltage signal and the rise-time DC control voltage signal to the first analog switching unit 304 and the first trapezoidal wave generating unit 305, respectively.

The first analog switching unit 304 is configured to modulate the positive or negative DC control voltage signal into corresponding square wave pulse according to the input pulse width control signal, and then output the square wave pulse to the first trapezoidal wave generating unit 305.

The first trapezoidal wave generating unit 305 is configured to generate and output the trapezoidal fire pulse according to the input fall-time and rise-time DC control voltage signal, and the square wave pulse.

The trapezoidal fire pulse generating device may further comprises a linear power amplifying unit 306 for linearly amplifying the pulse amplitude of the trapezoidal fire pulse M times, wherein M is an integer greater than 1.

Figure 4:
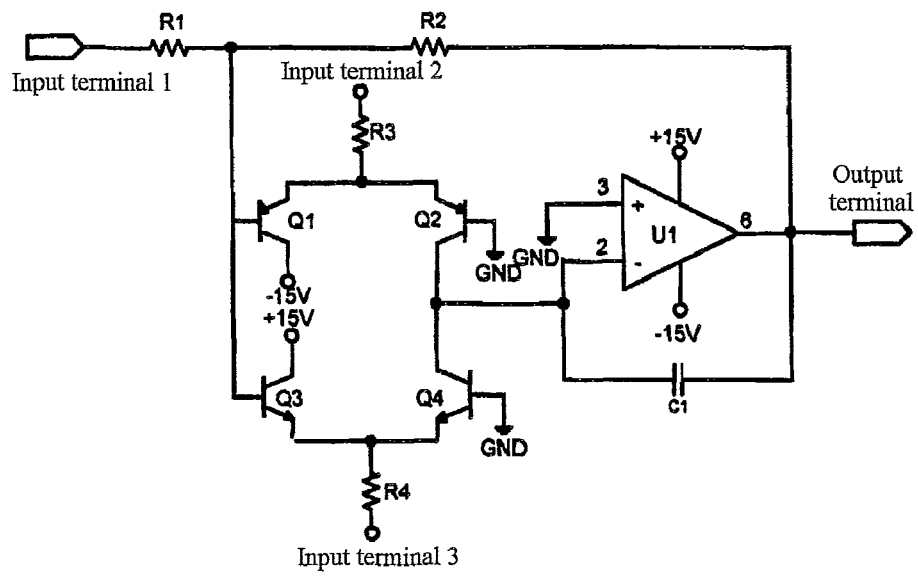
FIG. 4 is a diagram showing a internal circuit of a first trapezoidal wave generating unit according to the first embodiment of the present invention.

The first trapezoidal wave generating unit of the trapezoidal fire pulse generating device is a reverse integrator with a feedback loop constituted by a dual differential amplifying circuit, as shown in FIG. 4, and comprises an integral operation circuit and the dual differential amplifying circuit.

The integral operation circuit comprises a resistor R1, a resistor R2, an operational amplifier U1 and a feedback capacitor C1, wherein the resistor R1 is connected to the resistor R2 in series, the resistor R1 is connected to an input terminal 1 of the square wave pulse, the resistor R2 is connected to an output terminal of the trapezoidal wave pulse, and resistance values of the resistors R1 and R2 are equal to each other.

The dual differential amplifying circuit comprises PNP transistors Q1 and Q2, NPN transistors Q3 and Q4, and resistors R3 and R4, wherein transistors Q1 and Q3 have a common base input terminal which is connected to a common node of the resistor R1 and the resistor R2, transistors Q1 and Q2 have a common emitter terminal which is connected to the resistor R3 and the input terminal 3 of the rise-time DC control voltage signal; the transistors Q3 and Q4 have a common emitter terminal which is connected to the resistor R4 and the input terminal 2 of the fall-time DC control voltage signal, bases of the transistors Q2 and Q4 are grounded respectively, the transistors Q2 and Q4 have a common collector terminal which is connected to an reverse input terminal of the operational amplifier in the integral operation circuit.

Hereinafter, the operation principle of the trapezoidal fire pulse generating device provided by the first embodiment of the present invention are described in detail with reference to the case that the voltage value of the positive DC control voltage signal is set to be zero.

In the first embodiment, the voltage values of the positive DC control voltage signal, the negative DC control voltage signal, the rise-time DC control voltage signal and the fall-time DC control voltage signal of the trapezoidal fire pulse amplitude are represented by $+V_{p+}$, $-V_{P-}$, $-V_{RT}$, $+V_{FT}$, respectively.

In the first embodiment of the present invention, the principles and processes of the trapezoidal fire pulse generating device are similar when the voltage value of the negative DC control voltage signal is zero, and when the voltage value of the positive DC control voltage signal is zero. Therefore, the following detailed description only relates to the case that the positive DC control voltage signal is zero.

Since the negative pulse amplitude value of the trapezoidal fire pulse is equal to the voltage value of the negative DC control voltage signal, the first single-chip microcomputer control unit is able to determine the voltage value of the negative DC control voltage signal according to the pulse amplitude parameter value of the trapezoidal fire pulse required to be output when the voltage value of the positive DC control voltage signal is set to be zero.

The voltage value of the rise-time DC control voltage signal can be determined by substituting the rise time parameter value of the trapezoidal fire pulse required to be output as well as the voltage value of the negative DC control voltage signal into the following expression:

$$V_{RT} = \frac{C_1 \times V_{P-} \times R_4}{T_r} + 0.7, \qquad \text{Expression (1)}$$

The first single-chip microcomputer control unit is configured to determine the voltage value of the fall-time DC control voltage signal by substituting the fall time parameter value of the trapezoidal fire pulse required to be output as well as the voltage value of the negative DC control voltage signal into the following expression:

$$V_{FT} = \frac{C_1 \times V_{P-} \times R_3}{T_f} + 0.7, \qquad \text{Expression (2)}$$

In the above expressions (1) and (2), $V_{RT}$ is a positive voltage value of the rise-time DC control voltage signal;

$V_{FT}$ is the voltage value of the fall-time DC control voltage signal;

$T_r$ is the rise time parameter value; $T_f$ is the fall time parameter value;

$C_1$ is a capacitance value of the feedback capacitor C1 in FIG. 4;

$V_{p-}$ is a positive voltage value of the negative DC control voltage signal;

$V_{p+}$ is the voltage value of the positive DC control voltage signal;

$R_3$ and $R_4$ are the resistance values of the resistors R3 and R4 in FIG. 4, respectively.

The positive voltage output dual-channel DAC unit and the negative voltage output dual-channel DAC units in the first embodiment can employ conventional positive/negative voltage output dual-channel DACs in the art, and the operation principle thereof is omitted herein.

Figure 5:
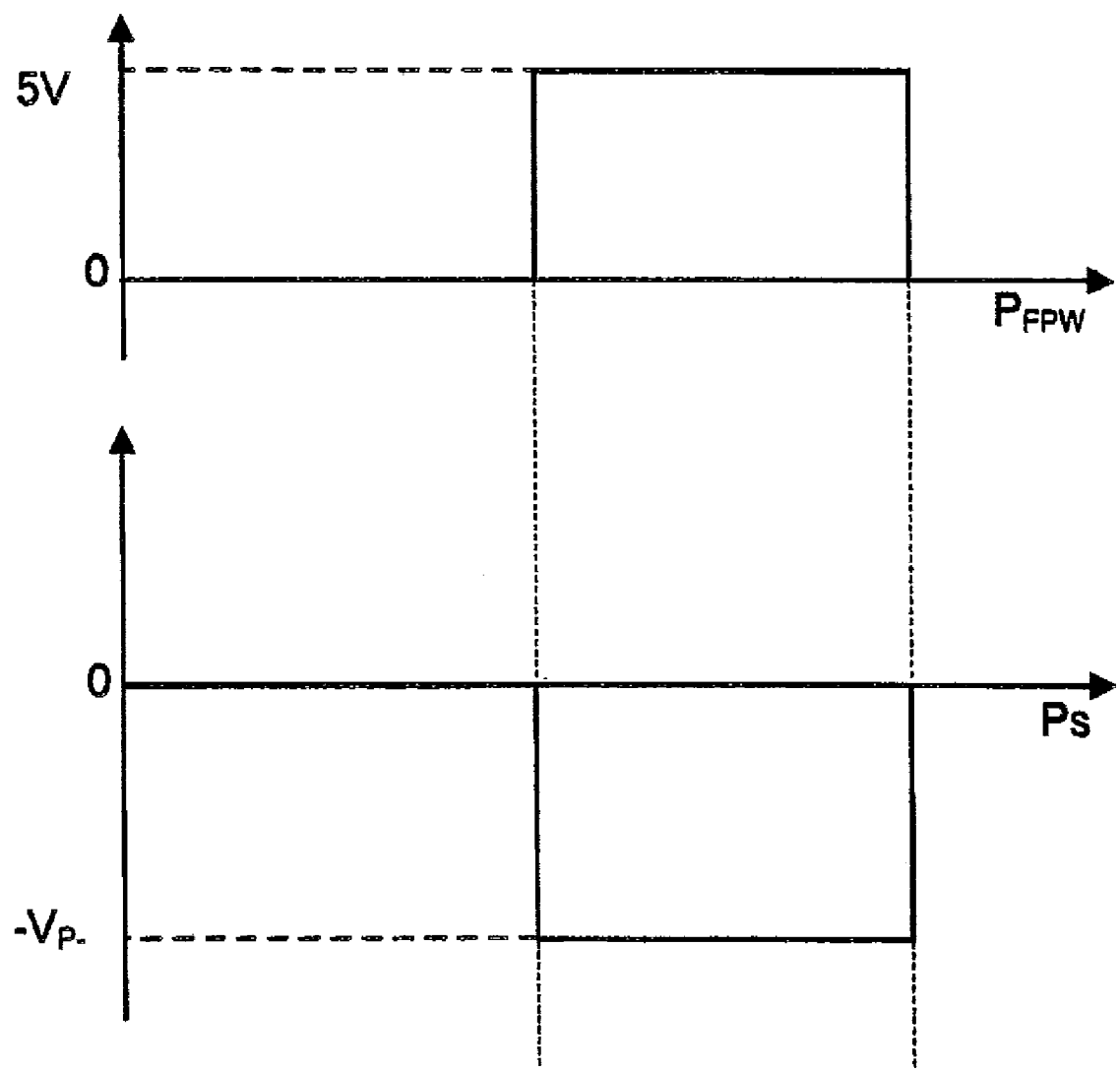
FIG. 5 is a contrast diagram showing waveforms of a pulse width control signal and a square wave pulse according to the first embodiment of the present invention.

The first analog switching unit modulates the positive DC control voltage signal, i.e., zero voltage signal, and the negative DC control voltage signal into corresponding square wave pulses according to the input pulse width control signal, and then outputs the square wave pulses to the first trapezoidal wave generating unit. FIG. 5 is a contrast diagram showing the pulse width control signal $P_{FPW}$ and the corresponding square wave pulse $P_S$. The pulse width control signal is a square or rectangle wave with a pulse amplitude of 5V, and the pulse amplitude of the corresponding square wave pulse $P_S$ is $-V_{P_-}$. The pulse width of the square wave pulse is equal to that of the pulse width control signal $P_{FPW}$.

When the pulse width control signal $P_{FPW}$ has a logic high level, the pulse amplitude of the output square wave pulse $P_S$ is equal to the voltage value $-V_{P_-}$ of the negative DC control voltage signal.

When the pulse width control signal $P_{FPW}$ has a logic low level, the pulse amplitude of the output square wave pulse $P_S$ is zero.

The operation principle of the first trapezoidal wave generating unit will be described below with reference to FIG. 4.

The first analog switching unit inputs the square wave pulse into the input terminal 1 of the reverse integrator, i.e., the first trapezoidal wave generating unit. The positive voltage output dual-channel DAC unit inputs the fall-time DC control voltage signal into the input terminal 2 of the reverse integrator. The negative voltage output dual-channel DAC unit inputs the rise-time DC control voltage signal into the input terminal 3 of the reverse integrator.

The operation principle of the reverse integrator in FIG. 4 is that the dual differential amplifying circuit consisting of the transistors Q1, Q2, Q3 and Q4 provides charge-discharge current to the feedback capacitor C1 of the integral operation circuit such that the corresponding trapezoidal fire pulses are output at the output terminal of the operational amplifier U1.

When the amplitude of the input square wave pulse is zero, the output of the reverse integrator is zero.

Since the input square wave pulse is zero, the voltage $V_{MID}$ at common node of the resistor R1 and resistor R2 is zero, such that the base voltages of the transistors Q1, Q2, Q3 and Q4 are all zero, and the dual differential amplifying circuit is in balanced state. The relationships of the current values of the transistors Q1, Q2, Q3 and Q4 are as follows:

$$I_{Q2} = I_{Q4}; \quad \text{Expression (3)}$$

$$I_{Q1} + I_{Q2} = \frac{V_{FT} - 0.7}{R_3}; \quad \text{Expression (4)}$$

$$I_{Q3} + I_{Q4} = \frac{V_{RT} - 0.7}{R_4}. \quad \text{Expression (5)}$$

In the above expressions, $I_{Q1}$, $I_{Q2}$, $I_{Q3}$ and $I_{Q4}$ are the current values of the transistors Q1, Q2, Q3 and Q4, respectively; and 0.7 V is a PN junction voltage between BEs of transistors.

No current flows through the feedback capacitor C1 in the operational amplifier circuit, thus the output of the reverse integrator is zero.

When the amplitude of the input square wave pulse jumps from zero to the voltage value of the negative DC control voltage signal, the output voltage value of the reverse integrator increases in a constant rate from zero to the positive voltage value of the negative DC control voltage signal so as to generate a rising edge of the trapezoidal fire pulse.

When the amplitude of the input square wave pulse jumps from zero to the voltage value $-V_{P_-}$ of the negative DC control voltage signal, since the resistance values of the resistors R1 and R2 are equal to each other, the voltage V at the common node of the resistors R1 and R2 jumps to $-V_{P_-}/2$, meanwhile, the base potential of the transistors Q1 and Q3 changes into a negative voltage, such that the transistors Q2 and Q3 are cut off, and the currents of the transistors Q1 and Q4 are maximum. The relationships of the current values of the transistors Q1, Q2, Q3 and Q4 are as follows:

$$I_{Q2} = I_{Q3} = 0; \quad \text{Expression (6)}$$

$$I_{Q1} = \frac{V_{FT} - V_{MID} - 0.7}{R_3}; \quad \text{Expression (7)}$$

$$I_{Q4} = \frac{V_{RT} - 0.7}{R_4}; \quad \text{Expression (8)}$$

As the transistor Q2 is cut off, the transistor Q4 draws current from the feedback capacitor C1, that is to say, the feedback capacitor C1 enters into a discharge process, such that the voltage at the output terminal of the reverse integrator starts to rise, and a rising edge of the trapezoidal fire pulse is framed when the pulse amplitude of the input square wave pulse $P_S$ is maintained to be $-V_{P_-}$. The rise rate of voltage depends on the discharge rate of the capacitor C1, which satisfies the following expression:

$$I = C\frac{\Delta V}{\Delta t}; \quad \text{Expression (9)}$$

In the above expression, I is a discharge current value of capacitor, i.e., the current value $I_{Q4}$ of the transistor Q4; C is a capacitance value, i.e., the capacitance value $C_1$ of the feedback capacitor C1; $T_r$ is the rise time; and $\Delta V/\Delta t$ indicates the rate of change in the output voltage of the operational amplifier, i.e., the slope of the rising edge of the output voltage, that is, the ratio between the pulse amplitude $V_{P_-}$ of the output trapezoidal fire pulse and the pulse rise time $T_r$.

Through substituting $I_{Q4}$ and $C_1$ into the expression (9) and replacing $\Delta V/\Delta t$ with $V_{P_-}/T_r$, the expression (9) is converted into:

$$I_{Q4} = \frac{C_1 \times V_{P_-}}{T_r} = \frac{V_{RT} - 0.7}{R_4}; \quad \text{Expression (10)}$$

The expression (10) is further converted into:

$$T_r = \frac{C_1 \times V_{P_-} \times R_4}{V_{RT} - 0.7}; \quad \text{Expression (11)}$$

From the expression (11), it can be seen that in the first embodiment of the present invention, when the pulse amplitude of the trapezoidal fire pulse has been determined, the relation between the voltage value of the rise-time DC control voltage signal and the rise time of the output trapezoidal fire pulse is fixed. The rise time of the output trapezoidal fire pulse can be precisely controlled and adjusted by precisely controlling and adjusting the voltage value of the rise-time DC control voltage signal.

In addition, the above expression (11) can be converted into:

$$V_{RT} = \frac{C_1 \times V_{P_-} \times R_4}{T_r} + 0.7,$$

i.e., the expression (1). When the rise time $T_r$ and the pulse amplitude of the trapezoidal fire pulse to be output have been determined, the voltage value of the rise-time DC control voltage signal can be determined by substituting the rise time parameter value as well as the positive voltage value of the negative DC control voltage signal into the expression (1).

When the amplitude of the input square wave pulse is maintained to be the voltage value of the negative DC control voltage signal, the output of the reverse integrator is maintained to be the positive voltage value of the negative DC control voltage signal.

When the amplitude of the input square wave pulse is maintained to be the voltage value of the negative DC control voltage signal, the voltage $V_{MID}$ at the common node of the resistors R1 and R2 is zero, such that the base voltages of the transistors Q1, Q2, Q3 and Q4 are all zero, and the dual differential amplifying circuit enters into the balanced state again. The relationships of the current values of the transistors Q1, Q2, Q3 and Q4 are entirely the same as expressions (3), (4) and (5), and no current flows through the feedback capacitor C1 in the operational amplifier circuit. Thus, the output of the reverse integrator is maintained to be the positive voltage value $+V_{p-}$ of the negative DC control voltage signal.

When the amplitude of the input square wave pulse jumps from the voltage value of the negative DC control voltage signal to zero, the output voltage of the reverse integrator decreases in a constant rate from the voltage value of the negative DC control voltage signal to zero so as to form a falling edge of the trapezoidal fire pulse.

When the amplitude of the input square wave pulse jumps from the voltage value of the negative DC control voltage signal to zero, the voltage V at the common node of the resistors R1 and R2 jumps to $V_{p-}/2$. Meanwhile, the base voltages of the transistors Q1 and Q3 changes into a positive voltage, such that the transistors Q1 and Q4 are cut off, and the currents of the transistors Q2 and Q3 are maximum. The relationships of the current values of the transistors Q1, Q2, Q3 and Q4 are as follows:

$$I_{Q1} = I_{Q4} = 0; \quad \text{Expression (12)}$$

$$I_{Q3} = \frac{V_{MID} - 0.7 + V_{RT}}{R_4}; \quad \text{Expression (13)}$$

$$I_{Q2} = \frac{V_{FT} - 0.7}{R_3}; \quad \text{Expression (14)}$$

As the transistor Q4 is cut off, the transistor Q2 charges the capacitor C1, and the output voltage at the output terminal of the operational amplifier (i.e., the output terminal of the reverse integrator) starts to fall. The fall rate depends on the charge rate of the capacitor, which satisfies the following expression:

$$I = C\frac{\Delta V}{\Delta t}; \quad \text{Expression (9)}$$

In the above expression, I is a discharge current value of capacitor, i.e., the current value $I_{Q2}$ of the transistor Q2; C is the capacitance value $C_1$ of the feedback capacitor C1; $T_f$ is the fall time; and $\Delta V/\Delta t$ indicates the rate of change in the output voltage of the operational amplifier, i.e., the slope of the falling edge of the output voltage, that is, the ratio between the pulse amplitude $V_{p-}$ of the output trapezoidal fire pulse and the fall time $T_f$.

Through substituting $I_{Q2}$ and $C_1$ into the expression (9) and replacing $\Delta V/\Delta t$ with $V_{p-}/T_f$, the expression (9) is converted into:

$$I_{Q2} = \frac{C_1 \times V_{p-}}{T_f} = \frac{V_{FT} - 0.7}{R_3}; \quad \text{Expression (15)}$$

The expression (15) is further converted into:

$$T_f = \frac{C_1 \times V_{p-} \times R_3}{V_{FT} - 0.7}; \quad \text{Expression (16)}$$

From the expression (16), it can be seen that when the pulse amplitude of the trapezoidal fire pulse has been determined, the relation between the voltage value of the fall-time DC control voltage signal and the fall time parameter value of the output trapezoidal fire pulse is fixed. The fall time of the output trapezoidal fire pulse can be precisely controlled and adjusted by precisely controlling and adjusting the voltage value of the fall-time DC control voltage signal.

In addition, the above expression (16) can be converted into:

$$V_{FT} = \frac{C_1 \times V_{p-} \times R_3}{T_f} + 0.7,$$

i.e., the expression (2). When the rise time and the pulse amplitude of the trapezoidal fire pulse to be output have been determined, the voltage value of the fall-time DC control voltage signal can be determined by substituting the fall time parameter value as well as the positive voltage value of the negative DC control voltage signal into the expression (2).

Figure 6:
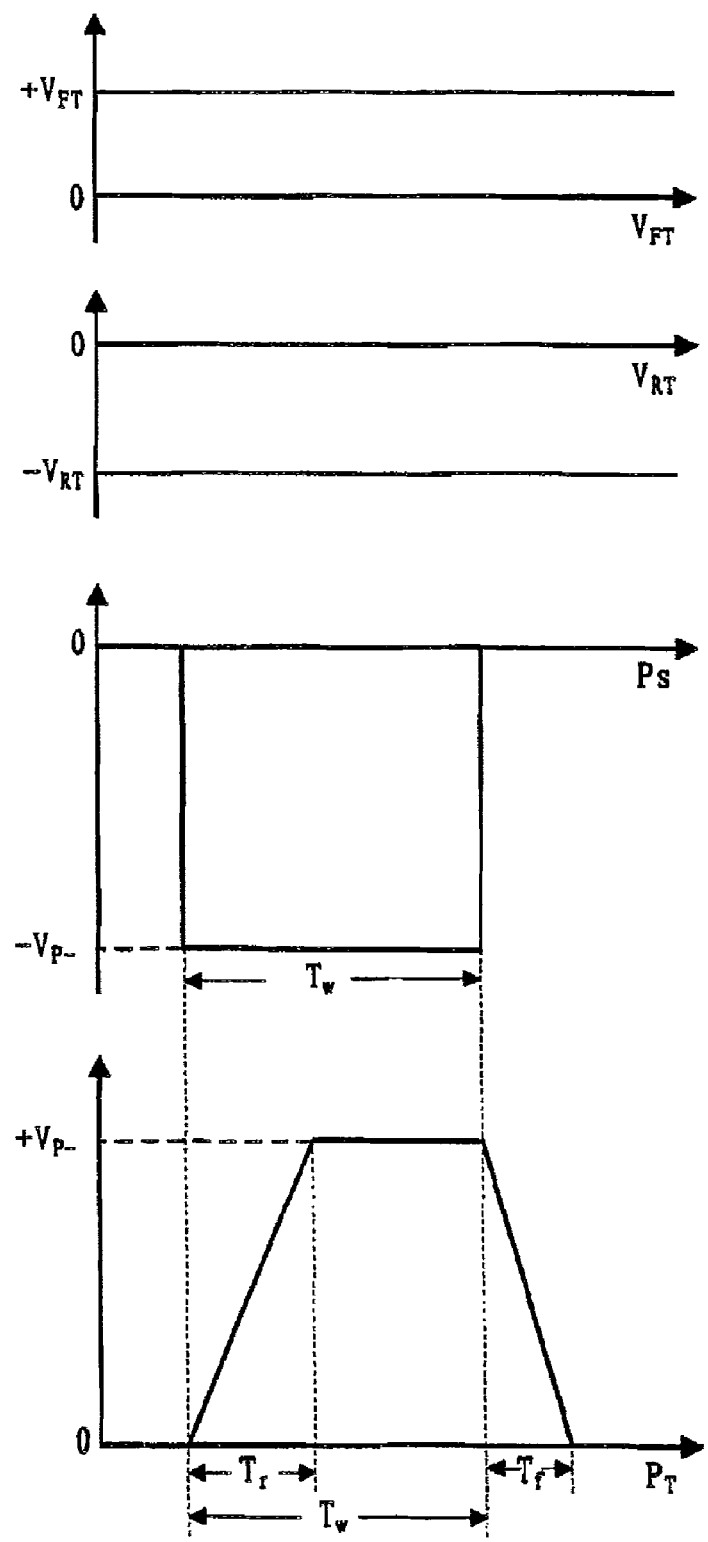
FIG. 6 is a diagram showing corresponding voltage waveforms of a rise-time DC control voltage signal, a fall-time DC control voltage signal, a square wave pulse and a trapezoidal fire pulse according to the first embodiment of the present invention.

FIG. 6 are diagrams showing voltage waveforms of the rise-time DC control voltage signal, the fall-time DC control voltage signal, the square wave pulse and the trapezoidal fire pulse, respectively. In particular, the pulse amplitude of the square wave pulse $P_S$ is $-V_{p-}$, the pulse amplitude of the output trapezoidal fire pulse is $+V_{p-}$, $T_r$ is the rise time of the trapezoidal fire pulse, $T_f$ is the fall time of the trapezoidal fire pulse, and $T_w$ is the pulse width of the trapezoidal fire pulse.

The operation principle of the trapezoidal fire pulse device is discussed above with reference to the case that the voltage value of the positive DC control voltage signal is zero. In the case that the voltage value of the negative DC control voltage signal is zero, the similar process exists. For example, the first single-chip microcomputer control unit determines the voltage value of the rise-time DC control voltage signal by substituting the rise time parameter value as well as the voltage value of the positive DC control voltage signal into the following expression:

$$V_{RT} = \frac{C_1 \times V_{p+} \times R_4}{T_r} + 0.7. \quad \text{Expression (17)}$$

In addition, the first signal-chip microcomputer control unit determines the voltage value of the fall-time DC control voltage signal by substituting the fall time parameter value of the trapezoidal fire pulse to be output as well as the voltage value of the positive DC control voltage signal into the following expression:

$$V_{FT} = \frac{C_1 \times V_{P+} \times R_3}{T_f} + 0.7. \qquad \text{Expression (18)}$$

In the expressions (17) and (18), $V_{p+}$ is the voltage value of the positive DC control voltage signal.

It can be seen from the expressions (17) and (18) that, in the case that the negative DC control voltage signal is zero, when the pulse amplitude of the output trapezoidal pulse has been determined, the relation between the voltage value of the fall-time DC control voltage signal and the fall time parameter value of the output trapezoidal fire pulse is fixed.

As seen clearly from FIG. 6 as well as the operation principle of the trapezoidal fire pulse generating device, the pulse width of the output trapezoidal fire pulse is determined by the pulse width of the input square wave pulse, the pulse amplitude of the trapezoidal fire pulse is determined by the pulse amplitude of the input square wave pulse, the rise time of the trapezoidal fire pulse is determined by the input rise-time DC control voltage signal, and the fall time of the trapezoidal fire pulse is determined by the fall-time DC control voltage signal. All the parameters of the output trapezoidal fire pulse can be controlled and adjusted by controlling and adjusting the parameters of the input square wave pulse and the voltage values of the rise-time and fall-time DC control voltage signals.

Second Embodiment

Figure 7:
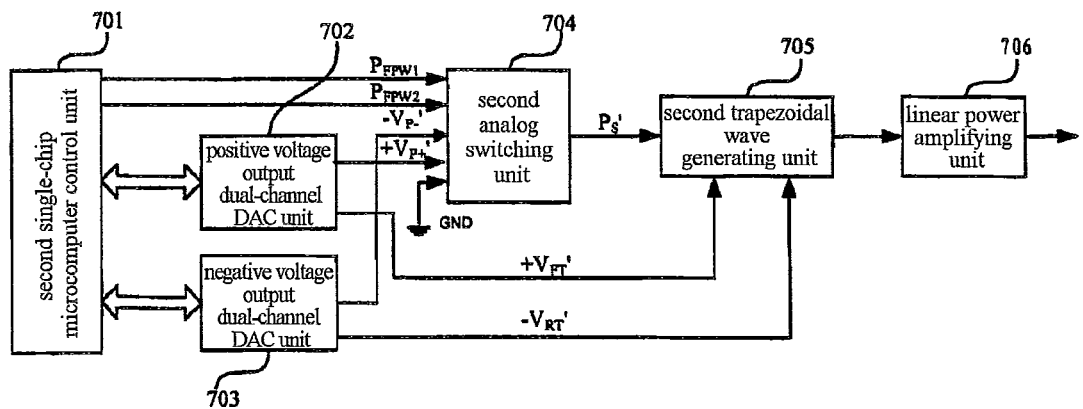
FIG. 7 is a structure diagram showing a trapezoidal fire pulse generating device according to a second embodiment of the present invention.

The second embodiment of the present invention provides another trapezoidal fire pulse generating device. As shown in FIG. 7, the trapezoidal fire pulse generating device comprises a second single-chip microcomputer control unit 701, a positive voltage output dual-channel DAC unit 702, a negative voltage output dual-channel DAC unit 703, a second analog switching unit 704 and a second trapezoidal wave generating unit 705.

The second single-chip microcomputer control unit 701 is configured to determine a voltage value of a positive DC control voltage signal and a voltage value of a negative DC control voltage signal according to pulse amplitude parameter values of positive and negative trapezoidal fire pulses required to be output.

The second single-chip microcomputer control unit 701 is further configured to determine a voltage value of a fall-time DC control voltage signal according to a first fall time parameter value of the positive and negative trapezoidal fire pulses required to be output and the voltage value of the positive DC control voltage signal, or according to a second fall time parameter value of the positive and negative trapezoidal fire pulses required to be output and the voltage value of the negative DC control voltage signal.

The second single-chip microcomputer control unit 701 is further configured to determine a voltage value of a rise-time DC control voltage signal according to the rise time parameter value of the positive and negative trapezoidal fire pulses required to be output and the voltage value of the positive and negative DC control voltage signals.

The second single-chip microcomputer control unit 701 is further configured to generate a corresponding digital signal according to the determined voltage value of the positive DC control voltage signal and the voltage value of the fall-time DC control voltage signal, and inputting the digital signal to the positive voltage output dual-channel DAC unit 702.

The second single-chip microcomputer control unit 701 is further configured to generate a corresponding digital signal according to the determined voltage value of the negative DC control voltage signal and the determined voltage value of the rise-time DC control voltage signal, and inputting the digital signal to the negative voltage output dual-channel DAC unit 703.

The second single-chip microcomputer control unit 701 is further configured to generate a first pulse width control signal and a second pulse width control signal both in the form of a square or rectangular wave, and output the first and second pulse width control signals to the second analog switching unit 704.

The positive voltage output dual-channel DAC unit 702 is configured to convert the received digital signal to a corresponding positive DC control voltage signal and a fall-time DC control voltage signal, output the positive DC control voltage signal to the second analog switching unit 704, and output the fall-time DC control voltage signal to the second trapezoidal wave generating unit 705.

The negative voltage output dual-channel DAC unit 703 is configured to convert the received digital signal to a corresponding negative DC control voltage signal and a rise-time DC control voltage signal, output the positive DC control voltage signal to the second analog switching unit 704, and output the rise-time DC control voltage signal to the second trapezoidal wave generating unit 705.

The second analog switching unit 704 is configured to modulate the positive DC control voltage signal, the negative DC control voltage signal and a zero voltage signal to corresponding positive and negative square-wave pulses according to the input first and second pulse width control signals; and output the positive and negative square-wave pulses to the second trapezoidal wave generating unit 705.

The second trapezoidal wave generating unit 705 is configured to generate positive and negative trapezoidal fire pulses according to the input fall-time DC control voltage signal, the input rise-time DC control voltage signal and the positive and negative square-wave pulses; and output the same.

The above trapezoidal fire pulse generating device may further comprise a linear power amplification unit 706 for linearly amplifying the pulse amplitude of the output positive and negative trapezoidal fire pulses M times, wherein M is an integer greater than 1.

In the above trapezoidal fire pulse generating device, the inner circuit of the second trapezoidal wave generating unit is the same as that of the first trapezoidal wave generating unit in the first embodiment. With reference to FIG. 4, the operation principle of the trapezoidal fire pulse generating device provided in the second embodiment of the present invention will be described as follows.

The pulse amplitude values of the positive and negative trapezoidal fire pulses required to be output includes a negative pulse amplitude value and a positive pulse amplitude value. The positive value corresponding to the negative pulse amplitude value is equal to the voltage value of the positive DC control voltage signal, and the negative value corresponding to the positive pulse amplitude value is equal to the voltage value of the negative DC control voltage signal. Therefore, the second single-chip microcomputer control unit is able to determine the voltage values of the positive and negative DC control voltage signals according to the pulse amplitude parameters of the positive and negative trapezoidal fire pulses required to be output.

The second single-chip microcomputer control unit further determines the voltage value of the fall-time DC control voltage signal according to the first fall time parameter value of the positive and negative trapezoidal fire pulses required to be output and the voltage value of the positive DC control voltage signal, or according to the second fall time parameter value of the trapezoidal fire pulses required to be output and the voltage value of the negative DC control voltage signal.

The method of determining includes:

determining the voltage value of the fall-time DC control voltage signal by substituting the first fall time parameter value of the trapezoidal fire pulse required to be output and the voltage value of the positive DC control voltage signal into the following expression:

$$V'_{FT} = \frac{C_1 \times V'_{P+} \times R_3}{T'_{f_1}} + 0.7;$$ Expression (19)

or determining the voltage value of the fall-time DC control voltage signal by substituting the second fall time parameter value of the trapezoidal fire pulse required to be output and the voltage value of the negative DC control voltage signal into the following expression:

$$V'_{FT} = \frac{C_1 \times V'_{P-} \times R_3}{T'_{f_2}} + 0.7.$$ Expression (20)

The second single-chip microcomputer control unit further determines the voltage values of the rise-time DC control voltage signal according to the rise time parameter value of the positive and negative trapezoidal fire pulses required to be output and the voltage values of the positive and negative DC control voltage signals. The process is performed as follows: determining the voltage value of the rise-time DC control voltage signal by substituting the rise time parameter value of the positive and negative trapezoidal fire pulses required to be output and the voltage values of the positive and negative DC control voltage signals into the following expression:

$$T'_r = \frac{C_1 \times (V'_{P+} + V'_{P-}) \times R_4}{V'_{RT} - 0.7}.$$ Expression (21)

In the above expressions (19) to (21), $T_{f1}'$ is a first fall time of the positive and negative trapezoidal fire pulses, $T_{f2}'$ is a second fall time of the positive and negative trapezoidal fire pulses, $V_{RT}'$ is a positive voltage value of the rise-time DC control voltage signal, $V_{FT}'$ is a voltage value of the fall-time DC control voltage signal, $V_{p-}'$ is a positive voltage value of the negative DC control voltage signal, $V_{p+}'$ is a voltage value of the positive DC control voltage signal, $C_1$ is the capacitance of a feedback capacitor C1 in the second trapezoidal wave generating unit; and $R_3$ and $R_4$ are the resistance values of resistors R3 and R4 in the second trapezoidal wave generating unit, respectively.

The functions of the positive voltage output dual-channel DAC unit and the negative voltage output dual-channel DAC unit in the second embodiment of the present invention are the same as the functions of the corresponding units in the first embodiment, and thus the detailed description thereof are omitted herein.

The second analog switching unit modulates the positive DC control voltage signal, the negative DC control voltage signal and a zero voltage signal to corresponding positive and negative square-wave pulses according to the first pulse width control signal and the second pulse width control signal.

The process of modulating includes: when the first pulse width control signal has a logic high level, the amplitude value of the output positive and negative square-wave pulses is set to be the voltage value of the positive DC control voltage signal; when the second pulse width control signal has a logic high level, the amplitude value of the output positive and negative square-wave pulses is set to be the voltage value of the negative DC control voltage signal; and when both of the first and second pulse width control signals have a logic low level, the amplitude of the output positive and negative square-wave pulses is set to be zero.

Figure 8:
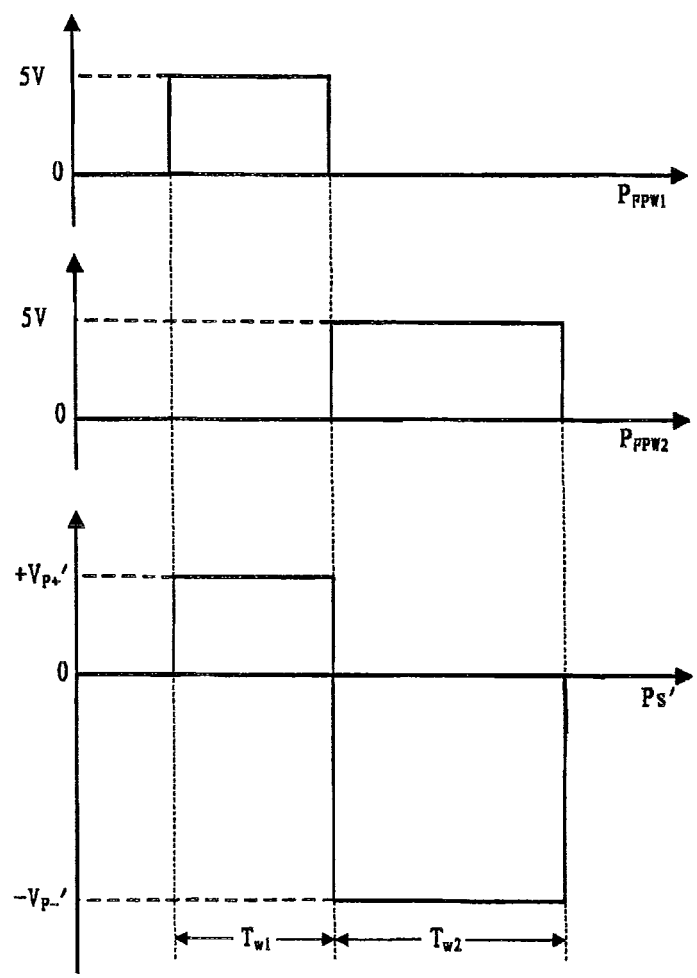
FIG. 8 is a diagram showing corresponding waveforms of a first pulse width control signal, a second pulse width control signal, and positive and negative square wave pulses according to the second embodiment of the present invention.

FIG. 8 is a voltage waveform view corresponding to the first pulse width control signal, the second pulse width control signal and the positive and negative square-wave pulses, wherein $P_{FPW1}$ is a first pulse width control signal, $P_{FPW2}$ is a second pulse width control signal and Ps' is a positive and negative square-wave pulse. It can be seen from FIG. 8 that the first and second pulse width control signals are square-wave or rectangular-wave pulses. The falling edge of the first pulse width control signal coincides with the rising edge of the second pulse width control signal.

Since the inner circuit of the second trapezoidal wave generating unit is the same as that of the first trapezoidal wave generating unit in the first embodiment, the principle of second trapezoidal wave generating unit for generating positive and negative trapezoidal fire pulses according to the input positive and negative square-wave pulses is similar to that of the first trapezoidal wave generating unit.

The specific operation of the second trapezoidal wave generating unit includes:

when the amplitude of the input positive and negative square-wave pulses is zero, the output of the inverse integrator is zero;

when the amplitude of the input positive and negative square-wave pulses jumps from zero to the voltage value of the positive DC control voltage signal, the output voltage value of the inverse integrator decreases in a constant rate from zero to the negative voltage value of the positive DC control voltage signal and a first falling edge of the positive and negative trapezoidal fire pulses is generated;

when the amplitude of the input positive and negative square-wave pulses is maintained to be the voltage value of the positive DC control voltage signal, the output of the inverse integrator is maintained to be the negative voltage value of the positive DC control voltage signal;

when the amplitude of the input square-wave pulses jumps from the voltage value of the positive DC control voltage signal to the voltage value of the negative DC control voltage signal, the output voltage value of the inverse integrator increases in a constant rate from the negative voltage value of the positive DC control voltage signal to the positive voltage value of the negative DC control voltage signal and a rising edge of the positive and negative trapezoidal fire pulses is generated;

when the amplitude of the input positive and negative square-wave pulses is maintained to be the voltage value of the negative DC control voltage signal, the output of the inverse integrator is maintained to be the positive voltage value of the negative DC control voltage signal; and when the amplitude of the input positive and negative square-wave pulses jumps from the voltage value of the negative DC control voltage signal to zero, the output voltage value of the inverse integrator decreases in a constant rate from the positive voltage value of the negative DC control voltage signal to zero and a second falling edge of the positive and negative trapezoidal fire pulses is generated.

Figure 9:
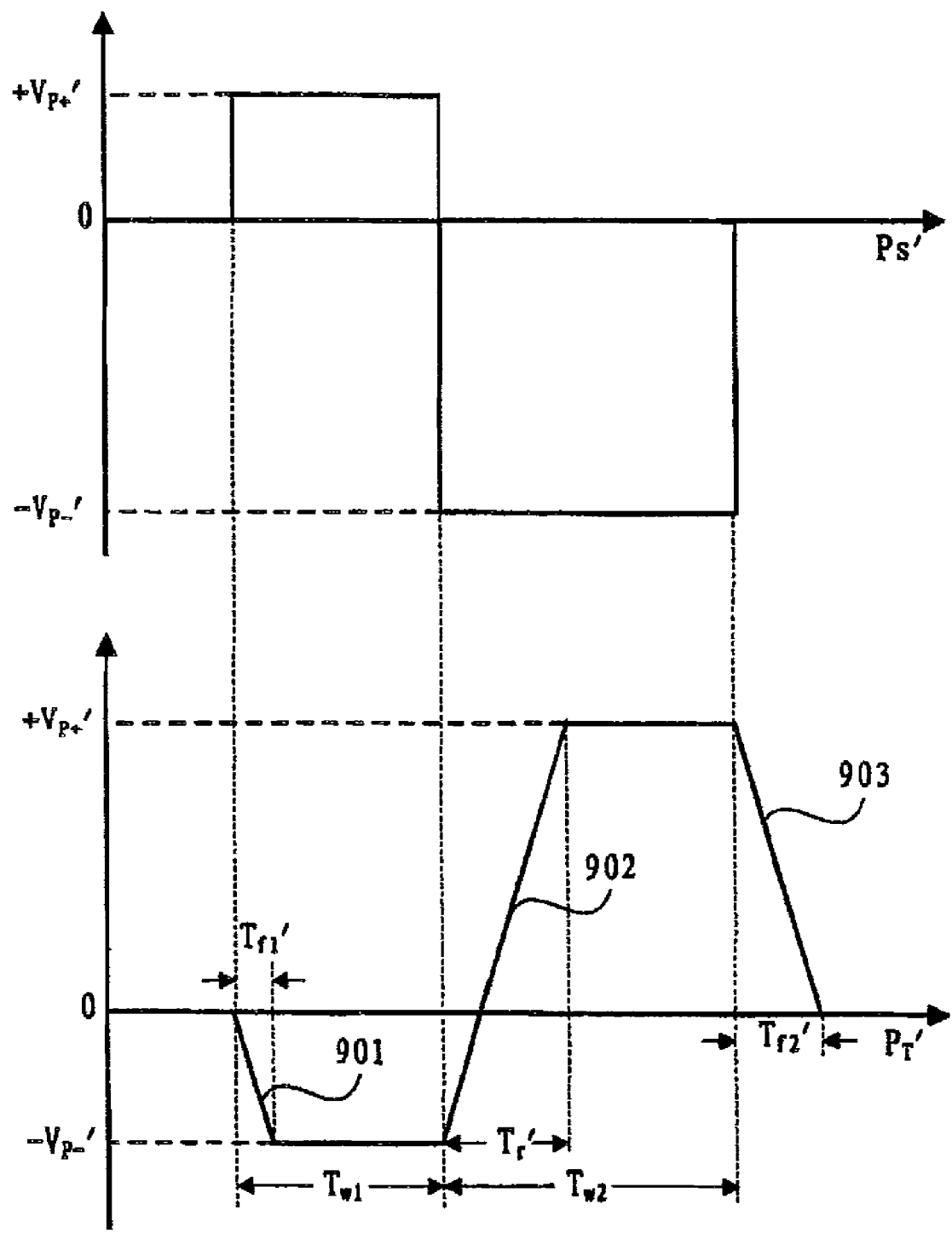
FIG. 9 is schematic diagram showing voltage waveforms of positive and negative square wave pulses and positive and negative trapezoidal fire pulses according to the second embodiment of the present invention.

FIG. 9 is a contrast diagram showing voltage waveforms of the input positive and negative square-wave pulses and the positive and negative trapezoidal fire pulses generated by the second trapezoidal wave generating unit. The positive and negative trapezoidal fire pulses $P_T'$ includes: a first falling edge 901, with a corresponding first fall time $T_{f1}'$; a rising edge 902, with a corresponding rise time $T_r'$; and a second falling edge 903, with a corresponding second fall time $T_{f2}'$. $T_{w1}$ is the first width value of the positive and negative trapezoidal fire pulses and $T_{w2}$ is the second width value of the positive and negative trapezoidal fire pulses.

Similarly, the relationships of the rise time, the first fall time and the second fall time of the positive and negative trapezoidal fire pulses generated by the second trapezoidal wave generating unit, and a voltage value of a rise-time DC control voltage signal and a voltage value of a fall-time DC control voltage signal satisfy the following expressions:

$$T_{f1}' = \frac{C_1 \times V_{P+}' \times R_3}{V_{FT}' - 0.7};$$  Expression (22)

$$T_{f2}' = \frac{C_1 \times V_{P-}' \times R_3}{V_{FT}' - 0.7};$$  Expression (23)

$$T_r' = \frac{C_1 \times (V_{P+}' + V_{P-}') \times R_4}{V_{RT}' - 0.7}.$$  Expression (24)

It can be seen from the above expressions that when the positive and negative pulse amplitudes of the positive and negative trapezoidal fire pulses have been determined, the rise time, the first fall time and the second fall time of the positive and negative trapezoidal fire pulses have fixed relations with a voltage value of the rise-time DC control voltage signal and the voltage value of the fall-time DC control voltage signal, respectively. Therefore, the rise time, the first fall time and the second fall time of the positive and negative trapezoidal fire pulses can be accurately controlled and adjusted by accurately controlling and adjusting the voltage value of the rise-time DC control voltage signal and the voltage value of the fall-time DC control voltage signal.

The trapezoidal fire pulse generating devices provided in the first and second embodiments of the present invention are merely preferred embodiments of the present invention. In practice, there may also be many specific embodiments. For example, the respective function units of the trapezoidal fire pulse generating devices may be further integrated, or split. The embodiments of the present invention is not intend to limit the variations of the inner structure of the trapezoidal fire pulse generating device within the principle of the trapezoidal fire pulse generating device provided in the embodiments of the present invention.

The inner circuits of the first trapezoidal wave generating unit and the second trapezoidal wave generating unit in the trapezoidal fire pulse generating devices provided in the first and second embodiment of the present invention are merely preferred embodiments of the trapezoidal fire pulse generating method. In practice, there may also be many other embodiments of the circuits.

Third Embodiment

Figure 10:
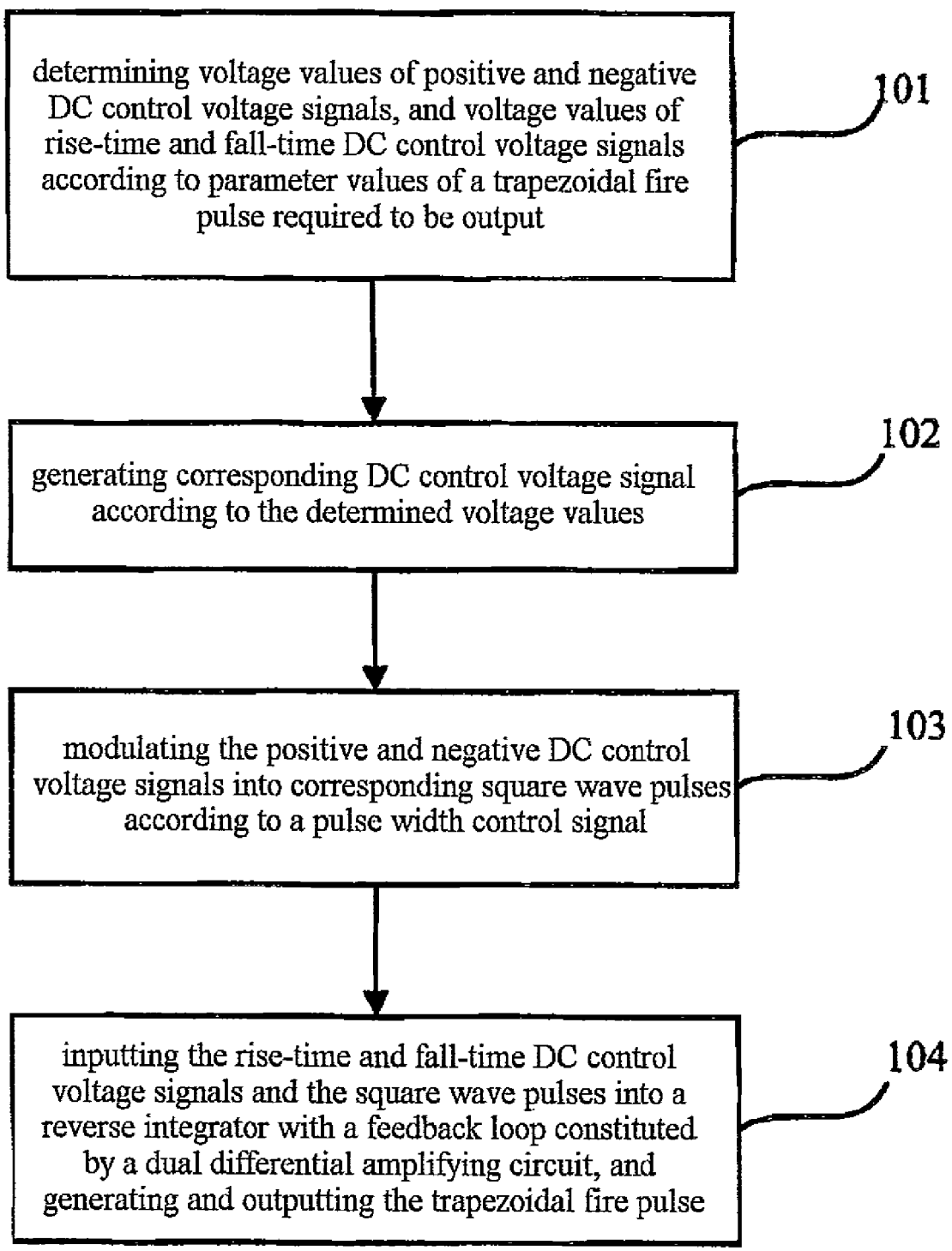
FIG. 10 is a flow chart of a trapezoidal fire pulse generating method according to a third embodiment of the present invention.

The third embodiment of the present invention provides a trapezoidal fire pulse generating method, as shown in FIG. 10, which comprises the following steps.

Step 101: determining the voltage value of the negative DC control voltage signal according to the pulse amplitude parameter value of a trapezoidal fire pulse required to be output and setting the voltage value of the positive DC control voltage signal to be zero; or, determining the voltage value of the positive DC control voltage signal according to the pulse amplitude parameter value of a trapezoidal fire pulse required to be output and setting the voltage value of the negative DC control voltage signal to be zero.

When the voltage value of the positive DC control voltage signal is zero, determining the voltage value of the rise-time DC control voltage signal according to the rise time parameter value of the trapezoidal fire pulse required to be output and the voltage value of the negative DC control voltage signal; and determining the voltage value of the fall-time DC control voltage signal according to the fall time parameter value of the trapezoidal fire pulse required to be output and the voltage value of the negative DC control voltage signal. Or, when the voltage value of the negative DC control voltage signal is zero, determining the voltage value of the rise-time DC control voltage signal according to the rise time parameter value of the trapezoidal fire pulse required to be output and the voltage value of the positive DC control voltage signal; and determining the voltage value of the fall-time DC control voltage signal according to the fall time parameter value of the trapezoidal fire pulse required to be output and the voltage value of the positive DC control voltage signal.

Step 102: generating a corresponding DC control voltage signal according to the determined voltage values of the negative and positive DC control voltage signals and the determined voltage values of the rise-time and fall-time DC control voltage signals.

Step 103: modulating the positive DC control voltage signal and the negative DC control voltage signal to corresponding square-wave pulses using a pulse width control signal in the form of a square-wave or rectangular-wave pulse.

The process of modulating includes: when the pulse width control signal has a logic high level, the amplitude of the output square-wave pulse is set to be the voltage value of the positive DC control voltage signal or the voltage value of the negative DC control voltage signal; and when the pulse width control signal has a logic low level, the amplitude of the output square-wave pulse is set to be zero.

Step 104: inputting the rise-time DC control voltage signal, the fall-time DC control voltage signal and the square-wave pulse into the inverse integrator with a feedback loop formed by a double differential amplifying circuit, generating and outputting a trapezoidal fire pulse. The process is performed as follows:

when the amplitude of the input square-wave pulse is zero, the output of the inverse integrator is zero;

when the amplitude of the input square-wave pulse jumps from zero to the voltage value of the negative DC control voltage signal, the output voltage value of the inverse integrator increases in a constant rate from zero to the positive voltage value of the negative DC control voltage signal, and a rising edge of the trapezoidal fire pulse is generated;

when the amplitude of the input square-wave pulse is maintained to be the voltage value of the negative DC control voltage signal, the output of the inverse integrator is maintained to be the positive voltage value of the negative DC control voltage signal;

when the amplitude of the input square-wave pulse jumps from the voltage value of the negative DC control voltage signal to zero, the output voltage value of the inverse integrator decreases in a constant rate from the positive voltage value of the negative DC control voltage signal to zero, and a falling edge of the trapezoidal fire pulses is generated, or when the amplitude of the input square-wave pulse jumps from zero to the voltage value of the positive DC control voltage signal, the output voltage value of the inverse integrator decreases in a constant rate from zero to the negative voltage value of the positive DC control voltage signal, and a falling edge of the trapezoidal fire pulse is generated;

when the amplitude of the input square-wave pulses is maintained to be the voltage value of the positive DC control voltage signal, the output of the inverse integrator is maintained to be the negative voltage value of the positive DC control voltage signal; and when the amplitude of the input square-wave pulses jumps from the voltage value of the positive DC control voltage signal to zero, the output voltage value of the inverse integrator increases in a constant rate from the negative voltage value of the positive DC control voltage signal to zero, and a rising edge of the trapezoidal fire pulse is generated.

In order to satisfy the voltage requirements of an ink-jet print head, the amplitude of the trapezoidal fire pulse may be linearly amplified M times so that the amplitude of the trapezoidal fire pulse can be increased to drive the nozzle to jet ink drop.

The amplified trapezoidal fire pulse amplitude FPA can be obtained according to the following expression:

$$-V_{P_-} = -\frac{FPA}{M} \qquad \text{Expression (25)}$$

In the above expression, M is the magnification times of the pulse amplitude, and M is an integer greater than 1

The expression for calculating the rise time of the linearly amplified trapezoidal fire pulse is as follows.

$$T_r = \frac{C1 \times FPA \times R_4}{M \times (V_{RT} - 0.7)} \qquad \text{Expression (26)}$$

The expression for calculating the fall time of the linearly amplified trapezoidal fire pulse is as follows.

$$T_f = \frac{C1 \times FPA \times R_3}{M \times (V_{RT} - 0.7)} \qquad \text{expression (27)}$$

It can be seen from expressions (26) and (27) that, the rise time and fall time of the linearly amplified trapezoidal fire pulse are identical to the rise time and fall time of the original trapezoidal fire pulse.

Fourth Embodiment

Figure 11:
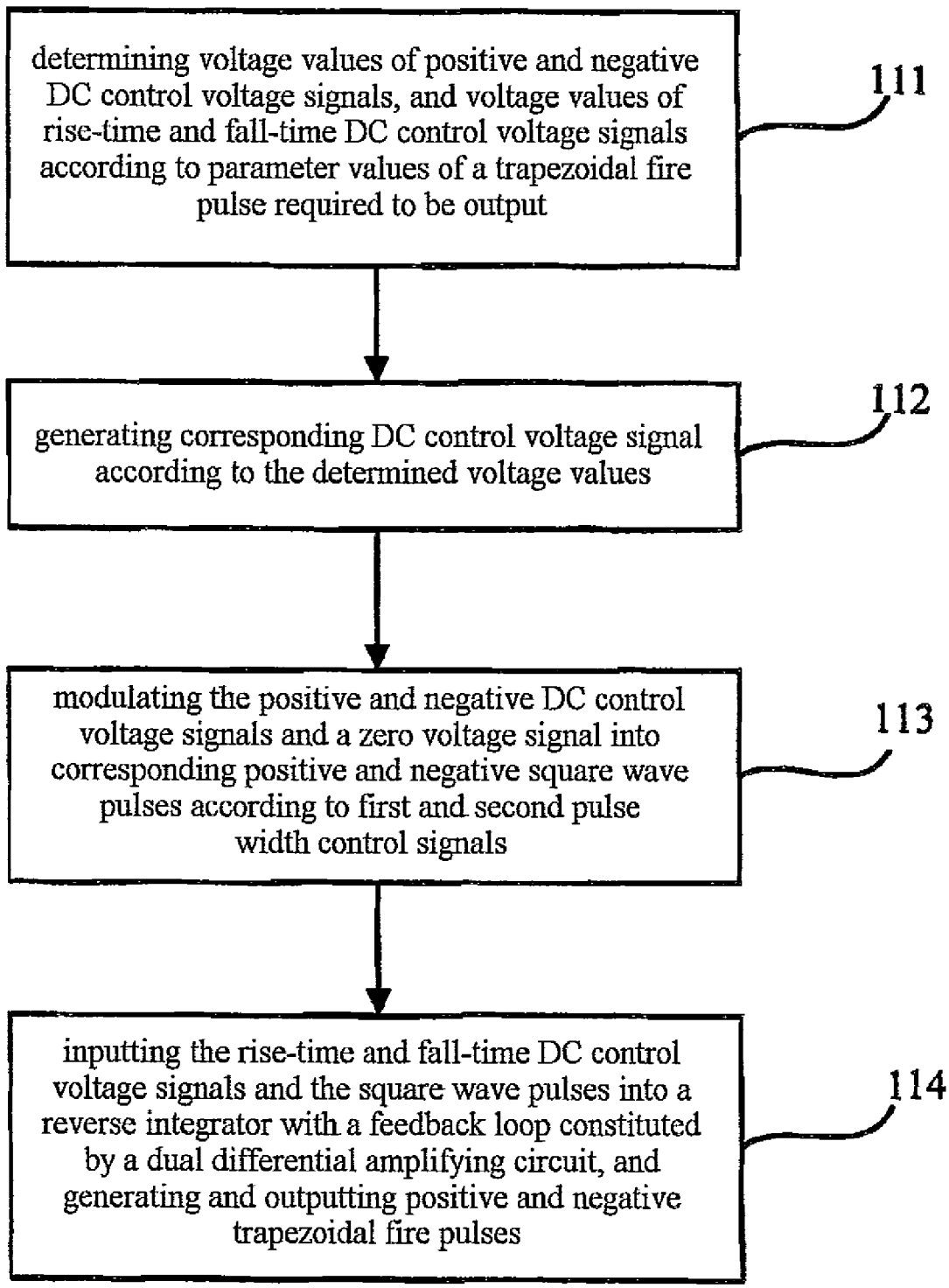
FIG. 11 is a flow chart of a trapezoidal fire pulse generating method according to a forth embodiment of the present invention.

The fourth embodiment of the present invention provides a trapezoidal fire pulse generating method, as shown in FIG. 11, which comprises the following steps.

Step 111: determining the voltage value of the positive DC control voltage signal and the voltage value of the negative DC control voltage signal according to the positive and negative pulse amplitudes of the positive and negative trapezoidal fire pulses required to be output; determining a voltage value of a fall-time DC control voltage signal according to the first fall time parameter value of the positive and negative trapezoidal fire pulses required to be output and the voltage value of the positive DC control voltage signal, or, determining the voltage value of the fall-time DC control voltage signal according to the second fall time parameter value of the positive and negative trapezoidal fire pulses required to be output and the voltage value of the negative DC control voltage signal; and determining the voltage value of the rise-time DC control voltage signal according to the rise-time parameter value of the positive and negative trapezoidal fire pulses required to be output and the voltage values of the positive and negative DC control voltage signals.

Step 112: generating a corresponding DC control voltage signal according to the determined voltage values of the negative and positive DC control voltage signals and the determined voltage values of the rise-time and fall-time DC control voltage signals.

Step 113: modulating the positive DC control voltage signal, the negative DC control voltage signal and the zero voltage signal to be positive and negative square-wave pulses using first and second pulse width control signals in the form of a square-wave or rectangular-wave pulse, wherein the falling edge of the first pulse width control signal coincides with the rising edge of the second pulse width control signal.

The process of modulating includes: when the first pulse width control signal has a logic high level, the amplitude value of the output positive and negative square-wave pulses is set to be the voltage value of the positive DC control voltage signal; when the second pulse width control signal has a logic high level, the amplitude value of the output positive and negative square-wave pulses is set to be the voltage value of the negative DC control voltage signal; and when both of the first and second pulse width control signals have a logic low level, the amplitude value of the output positive and negative square-wave pulses is set to be zero.

Step 114: inputting the rise-time DC control voltage signal, the fall-time DC control voltage signal and the positive and negative square-wave pulses into the inverse integrator with a feedback loop formed by a double differential amplifying circuit, generating and outputting positive and negative trapezoidal fire pulses. The process is performed as follows:

when the amplitude of the input positive and negative square-wave pulses is zero, the output of the inverse integrator is zero;

when the amplitude of the input positive and negative square-wave pulses jumps from zero to the voltage value of the positive DC control voltage signal, the output voltage value of the inverse integrator decreases in a constant rate from zero to the negative voltage value of the positive DC control voltage signal, and a first falling edge of the positive and negative trapezoidal fire pulses is generated;

when the amplitude of the input positive and negative square-wave pulses is maintained to be the voltage value of the positive DC control voltage signal, the output of the inverse integrator is maintained to be the negative voltage value of the positive DC control voltage signal;

when the amplitude of the input positive and negative square-wave pulses jumps from the voltage value of the positive DC control voltage signal to the voltage value of the negative DC control voltage signal, the output voltage value of the inverse integrator decreases in a constant rate from the negative voltage value of the positive DC control voltage signal to the positive voltage value of the negative DC control voltage signal, and a rising edge of the positive and negative trapezoidal fire pulses is generated;

when the amplitude of the input positive and negative square-wave pulses is maintained to be the voltage value of the negative DC control voltage signal, the output of the inverse integrator is maintained to be the positive voltage value of the negative DC control voltage signal; and when the amplitude of the input positive and negative square-wave pulses jumps from the voltage value of the negative DC control voltage signal to zero, the output voltage value of the inverse integrator decreases in a constant rate from the positive voltage value of the negative DC control voltage signal to zero, and a second falling edge of the positive and negative trapezoidal fire pulses is generated.

The trapezoidal fire pulse generating method according to the present invention comprises: determining the voltage value of the positive DC control voltage signal, the voltage value of the negative DC control voltage signal, the voltage value of the rise-time DC control voltage signal and a fall-time DC control voltage signal according to the parameter values of a trapezoidal fire pulse required to be output, and generating a corresponding DC control voltage signal; modulating the positive DC control voltage signal and the negative DC control voltage signal to a square-wave pulse; inputting the rise-time DC control voltage signal, the fall-time DC control voltage signal and the square-wave pulse into the inverse integrator, and generating a trapezoidal fire pulse. The rise time and the fall time of the trapezoidal fire pulse have fixed relations with the voltage value of the rise-time DC control voltage signal and the voltage value of the fall-time DC control voltage signal, respectively. Therefore, the rise time and fall time of the output trapezoidal fire pulse may be accurately controlled and adjusted by accurately controlling and adjusting the voltage value of the rise-time DC control voltage signal and the voltage value of the fall-time DC control voltage signal. Therefore, the output trapezoidal fire pulse can be more stable and accurate so as to avoid the problem in the traditional trapezoidal fire pulse generating system that the waveform of the output trapezoidal fire pulse has fluctuation due to load variations. In addition, different types of trapezoidal fire pulses can be generated and output according to different input square-wave pulse signals.

Moreover, the trapezoidal fire pulse generating device provided in the embodiments of the present invention can digitally adjust the rise/fall-time DC control voltage signal, and has a simple structure and high adjustment accurateness. Furthermore, a plurality of types of trapezoidal fire pulses may be output so as to satisfy the requirements of different types of ink-jet print heads.

The present invention is not limited to the descriptions and embodiments mentioned above. Variations and modification made by those skilled in the art according to the disclosure herein should be within the scope of the present invention.

The invention claimed is:

1. A trapezoidal fire pulse generating device, comprising a first single-chip microcomputer control unit, a positive voltage output dual-channel DAC unit, a negative voltage output dual-channel DAC unit, a first analog switching unit and a first trapezoidal wave generating unit, wherein the first single-chip microcomputer control unit is configured to determine voltage values of positive and negative DC control voltage signals according to a pulse amplitude parameter value of the trapezoidal fire pulse required to be output, wherein the control unit is further configured to determine a voltage value of rise-time DC control voltage signal and a voltage value of fall-time DC control voltage signal and generate a pulse width control signal in a square-wave or rectangular-wave pulse form, according to a rise time parameter value and a fall time parameter value of the trapezoidal fire pulse required to be output as well as the voltage values of positive and negative DC control voltage signals, wherein the positive voltage output dual-channel DAC unit is configured to receive from the control unit a digital signal for representing the voltage value of the positive DC control voltage signal and the voltage value of the fall-time DC control voltage signal, and convert the digital signal to a corresponding positive DC control voltage signal and a corresponding fall-time DC control voltage signal, wherein the negative voltage output dual-channel DAC unit is configured to receive from the control unit a digital signal for representing the voltage value of the negative DC control voltage signal and the voltage value of the rise-time DC control voltage signal, and convert the digital signal to a corresponding negative DC control voltage signal and a corresponding rise-time DC control voltage signal, wherein the first analog switching unit is configured to modulate the positive and negative DC control voltage signals received from the positive and negative voltage output dual-channel DAC units, respectively, to corresponding square-wave pulses according to the pulse width control signal received from the control unit, and output the square-wave pulses to the first trapezoidal wave generating unit, and wherein the first trapezoidal wave generating unit is configured to generate a trapezoidal fire pulse based on the square-wave pulses and the fall-time and rise-time DC control voltage signals, and output the generated trapezoidal fire pulse.

2. The device according to claim 1, wherein the first single-chip microcomputer control unit determines the voltage value of the negative DC control voltage signal according to the pulse amplitude parameter value of the trapezoidal fire pulse required to be output, and sets the voltage value of the positive DC control voltage signal to be zero; or determines the voltage value of the positive DC control voltage signal according to the pulse amplitude parameter value of the trapezoidal fire pulse required to be output, and sets the voltage value of the negative DC control voltage signal to be zero.

3. The device according to claim 2, wherein the control unit determines the voltage value of the rise-time DC control voltage signal according to the rise time parameter value of the trapezoidal fire pulse required to be output and the voltage value of the negative DC control voltage signal when the voltage value of the positive DC control voltage signal is zero; or the control unit determines the voltage value of the rise-time DC control voltage signal according to the rise time parameter value of the trapezoidal fire pulse required to be output and the voltage value of the positive DC control voltage signal when the voltage value of the negative DC control voltage signal is zero.

4. The device according to claim 2, wherein the control unit determines the voltage value of the fall-time DC control voltage signal according to the fall time parameter value of the trapezoidal fire pulse required to be output and the voltage value of the negative DC control voltage signal when the voltage value of the positive DC control voltage signal is zero; or the control unit determines the voltage value of the fall-time DC control voltage signal according to the fall time parameter value of the trapezoidal fire pulse required to be output and the voltage value of the positive DC control voltage signal when the voltage value of the negative DC control voltage signal is zero.

5. The device according to claim 1, wherein the first trapezoidal wave generating unit is a reverse integrator with a feedback loop constituted by a dual differential amplifying circuit, and comprises:

an integral operation circuit, comprising a first resistor, a second resistor, a first operational amplifier and a first feedback capacitor, wherein the first resistor is connected in series to the second resistor, the first resistor is connected to a first input of the square-wave pulse, the second resistor is connected to an output of the trapezoidal wave, and the first resistor is equal to the second resistor in its resistor value; and the dual differential amplifying circuit, comprising a first PNP transistor, a second PNP transistor, a third NPN transistor, a fourth NPN transistor, a third resistor and a fourth resistor; wherein the first PNP transistor and the third NPN transistor have a common base input terminal which is connected to a common node of the first resistor and the second resistor; the first PNP transistor and the second PNP transistor have a common emitter terminal which is connected to the third resistor and a third input terminal of the rise-time DC control voltage signal; the third and the fourth NPN transistors have a common emitter terminal which is connected to the fourth resistor and a second input terminal of the fall-time DC control voltage signal; the bases of the second PNP transistor and the fourth NPN transistor are grounded, respectively, and the second PNP transistor and the fourth NPN transistor have a common collector terminal which is connected to a reverse input terminal of the operational amplifier in the integral operation circuit.

6. The device according to claim 5, wherein, when the voltage value of the positive DC control voltage signal is zero, the control unit determines the voltage value of the rise-time DC control voltage signal by substituting the rise time parameter value of the trapezoidal fire pulse required to be output and the voltage value of the negative DC control voltage signal into the following expression:

$$V_{RT} = \frac{C_1 \times V_{P-} \times R_4}{T_r} + 0.7,$$

and further determines the voltage value of the fall-time DC control voltage signal by substituting the fall time parameter value of the trapezoidal fire pulse required to be output and the voltage value of the negative DC control voltage signal into the following expression:

$$V_{FT} = \frac{C_1 \times V_{P-} \times R_3}{T_f} + 0.7;$$

and when the voltage value of the negative DC control voltage signal is zero, the first single-chip microcomputer control unit determines the voltage value of the rise-time DC control voltage signal by substituting the rise time parameter value and the voltage value of the positive DC control voltage signal into the following expression:

$$V_{RT} = \frac{C_1 \times V_{P+} \times R_4}{T_r} + 0.7,$$

and further determines the voltage value of the fall-time DC control voltage signal by substituting the fall time parameter value of the trapezoidal fire pulse required to be output and the voltage value of the positive DC control voltage signal into the following expression:

$$V_{FT} = \frac{C_1 \times V_{P+} \times R_3}{T_f} + 0.7,$$

where $V_{RT}$ is a positive voltage value of the rise-time DC control voltage signal, $V_{FT}$ is a voltage value of the fall-time DC control voltage signal, $T_r$ is a rise time parameter value, $T_f$ is a fall time parameter value, $C_1$ is a value of the first feedback capacitor, $V_{p-}$ is a positive voltage value of negative DC control voltage signal, $V_{p+}$ is a voltage value of positive DC control voltage signal, R3 and R4 are values of the third and fourth resistors, respectively.

7. The device according to claim 1, further comprising a linear power amplifying unit for linearly amplifying the pulse amplitude of the trapezoidal fire pulse M times, wherein M is an integer greater than 1.

8. A trapezoidal fire pulse generating device, comprising a second single-chip microcomputer control unit, a positive voltage output dual-channel DAC unit, a negative voltage output dual-channel DAC unit, a second analog switching unit and a second trapezoidal wave generating unit, wherein the second single-chip microcomputer control unit is configured to perform the following steps:

determining voltage values of positive and negative DC control voltage signals according to pulse amplitude parameter values of the positive and negative trapezoidal fire pulses required to be output, determining a voltage value of fall-time DC control voltage signal according to a first fall time parameter value of the positive and negative trapezoidal fire pulses required to be output and the voltage value of the positive DC control voltage signal; or determining a voltage value of fall-time DC control voltage signal according to a second fall time parameter value of the positive and negative trapezoidal fire pulses required to be output and the voltage value of the negative DC control voltage signal, determining a voltage value of a rise-time DC control voltage signal according to a rise time parameter value of the positive and negative trapezoidal fire pulses required to be output and the voltage values of the positive and negative DC control voltage signals, generating a corresponding digital signal according to the determined voltage value of the positive DC control voltage signal and the determined voltage value of the fall-time DC control voltage signal, and inputting the digital signal to the positive voltage output dual-channel DAC unit, generating a corresponding digital signal according to the determined voltage value of the negative DC control voltage signal and the determined voltage value of the rise-time DC control voltage signal, and inputting the digital signal to the negative voltage output dual-channel DAC unit, and generating a first pulse width control signal and a second pulse width control signal which are both in a form of a square-wave or rectangular-wave pulse and inputting the same to the second analog switching unit, wherein the positive voltage output dual-channel DAC unit is configured to convert the received digital signal to a corresponding positive DC control voltage signal and a fall-time DC control voltage signal, input the positive DC control voltage signal to the second analog switching unit, and input the fall-time DC control voltage signal to the second trapezoidal wave generating unit, wherein the negative voltage output dual-channel DAC unit is configured to convert the received digital signal to a corresponding negative DC control voltage signal and a rise-time DC control voltage signal, input the positive DC control voltage signal to the second analog switching unit, and input the rise-time DC control voltage signal to the second trapezoidal wave generating unit, wherein the second analog switching unit is configured to modulate the positive and negative DC control voltage signals and a zero voltage signal to corresponding positive and negative square-wave pulses according to the input first and second pulse width control signals, and output the square-wave pulses to the second trapezoidal wave generating unit, and wherein the second trapezoidal wave generating unit is configured to generate and output positive and negative trapezoidal fire pulses according to the fall-time DC control voltage signal, the rise-time DC control voltage signal and the square-wave pulses.

9. The device according to claim 8, wherein the second trapezoidal wave generating unit is a reverse integrator with a feedback loop constituted by a dual differential amplifying circuit, and comprises:

an integral operation circuit, comprising a first resistor, a second resistor, a first operational amplifier and a first feedback capacitor, wherein the first resistor is connected in series to the second resistor, the first resistor is connected to an input terminal of the square-wave pulse, the second resistor is connected to an output terminal of the trapezoidal wave, and the first resistor is equal to the second resistor in its resistor value; and the dual differential amplifying circuit, comprising a first PNP transistor, a second PNP transistor, a third NPN transistor, a fourth NPN transistor, a third resistor and a fourth resistor; wherein the first PNP transistor and the third NPN transistor have a common base input terminal which is connected to a common node of the first resistor and the second resistor; the first PNP transistor and the second PNP transistor have a common emitter terminal which is connected to the third resistor and an input terminal of the rise-time DC control voltage signal; the third and the fourth NPN transistors have a common emitter terminal which is connected to the fourth resistor and an input terminal of the fall-time DC control voltage signal; the bases of the second PNP transistor and the fourth NPN transistor are grounded, respectively, and the second PNP transistor and the fourth NPN transistor have a common collector terminal which is connected to a reverse input terminal of the operational amplifier in the integral operation circuit.

10. The device according to claim 9, wherein
the second single-chip microcomputer control unit determines the voltage value of the fall-time DC control voltage signal by substituting the first fall time parameter value and the voltage value of the positive DC control voltage signal into the following expression:

$$V'_{FT} = \frac{C_1 \times V'_{P+} \times R_3}{T'_{f_1}} + 0.7;$$

or determines the voltage value of the fall-time DC control voltage signal by substituting the second fall time parameter value and the voltage value of the negative DC control voltage signal into the following expression:

$$V'_{FT} = \frac{C_1 \times V'_{P-} \times R_3}{T'_{f_2}} + 0.7;$$

and the second single-chip microcomputer control unit determines the voltage value of the rise-time DC control voltage signal by substituting the rise time parameter value and the voltage values of the positive and negative DC control voltage signals into the following expression:

$$T'_r = \frac{C_1 \times (V'_{P+} + V'_{P-}) \times R_4}{V'_{RT} - 0.7};$$

and where $T_{f1}'$ is a first fall time of the positive and negative trapezoidal fire pulses, $T_{f2}'$ is a second fall time of the positive and negative trapezoidal fire pulses, $V_{RT}'$ is a positive voltage value of the rise-time DC control voltage signal, $V_{FT}'$ is a voltage value of the fall-time DC control voltage signal, $V_{p-}'$ is a positive voltage value of the negative DC control voltage signal, $V_{p+}'$ is a voltage value of the positive DC control voltage signal, $C_1$ is a value of the first feedback capacitor, R3 and R4 are values of the third and fourth resistors, respectively.

11. The device according to claim 8, further comprising a linear power amplifying unit for linearly amplifying the pulse amplitude of the positive and negative trapezoidal fire pulses M times, wherein M is an integer greater than 1.

12. A method for generating trapezoidal fire pulses, comprising:

determining voltage values of positive and negative DC control voltage signals according to a pulse amplitude parameter value of the trapezoidal fire pulse required to be output, and determining a voltage value of a rise-time DC control voltage signal and a voltage value of a fall-time DC control voltage signal according to a rise time parameter value and a fall time parameter value of the trapezoidal fire pulse required to be output as well as the voltage values of positive and negative DC control voltage signals;

generating corresponding DC control voltage signals according to the determined voltage values of positive and negative DC control voltage signals, the voltage value of the rise-time DC control voltage signal and the voltage value of the fall-time DC control voltage signal;

modulating the positive and negative DC control voltage signals to corresponding square-wave pulses by using a pulse width control signal in a square-wave or rectangular-wave pulse form; and inputting the rise-time DC control voltage signal, the fall-time DC control voltage signal and the square-wave pulses to a reverse integrator with a feedback loop constituted by a dual differential amplifying circuit so as to generate a trapezoidal fire pulse and output the same.

13. The method according to claim 12, wherein the step of determining voltage values of positive and negative DC control voltage signals according to a pulse amplitude parameter value of the trapezoidal fire pulse further comprises:
determining the voltage value of the negative DC control voltage signal according to a pulse amplitude parameter value of the trapezoidal fire pulse required to be output, and setting the voltage value of the positive DC control voltage signal to be zero; or determining the voltage value of the positive DC control voltage signal according to a pulse amplitude parameter value of the trapezoidal fire pulse required to be output and setting the voltage value of the negative DC control voltage signal to be zero.

14. The method according to claim 13, wherein the step of determining a voltage value of a rise-time DC control voltage signal and a voltage value of a fall-time DC control voltage signal according to a rise time parameter value and a fall time parameter value of the trapezoidal fire pulse required to be output as well as the voltage values of positive and negative DC control voltage signals further comprises:
when the voltage value of the positive DC control voltage signal is zero, determining the voltage value of the rise-time DC control voltage signal according to the rise time parameter value of the trapezoidal fire pulse required to be output and the voltage value of the negative DC control voltage signal, and determining the voltage value of the fall-time DC control voltage signal according to the fall time parameter value of the trapezoidal fire pulse required to be output and the voltage value of the negative DC control voltage signal.

15. The method according to claim 13, wherein the step of determining a voltage value of a rise-time DC control voltage signal and a voltage value of a fall-time DC control voltage signal according to a rise time parameter value and a fall time parameter value of the trapezoidal fire pulse required to be output as well as the voltage values of positive and negative DC control voltage signals further comprises:
when the voltage value of the negative DC control voltage signal is zero, determining the voltage value of the rise-time DC control voltage signal according to the rise time parameter value of the trapezoidal fire pulse required to be output and the voltage value of the positive DC control voltage signal, and determining the voltage value of the fall-time DC control voltage signal according to the fall time parameter value of the trapezoidal fire pulse required to be output and the voltage value of the positive DC control voltage signal.

16. The method according to claim 12, wherein the step of generating the trapezoidal fire pulse by the reverse integrator and output the same further comprises:
when the amplitude of the input square-wave pulse is zero, the output of the reverse integrator is zero;
when the amplitude of the input square-wave pulse jumps from zero to the voltage value of the negative DC control voltage signal, the output voltage value of the reverse integrator increases in a constant rate from zero to a positive voltage value of the negative DC control voltage signal and a rising edge of the trapezoidal fire pulse is generated;
when the amplitude of the input square-wave pulse is maintained to be the voltage value of the negative DC control voltage signal, the output of the reverse integrator is maintained to be the positive voltage value of the negative DC control voltage signal; and
when the amplitude of the input square-wave pulse jumps from the voltage value of the negative DC control voltage signal to zero, the output voltage value of the reverse integrator decreases in a constant rate from the positive voltage value of the negative DC control voltage signal to zero and a falling edge of the trapezoidal fire pulse is generated; or
when the amplitude of the input square-wave pulse jumps from zero to the voltage value of the positive DC control voltage signal, the output voltage value of the reverse integrator decreases in a constant rate from zero to a negative voltage value of the positive DC control voltage signal and a falling edge of the trapezoidal fire pulse is generated;
when the amplitude of the input square-wave pulse is maintained to be the voltage value of the positive DC control voltage signal, the output of the reverse integrator is maintained to be the negative voltage value of the positive DC control voltage signal; and
when the amplitude of the input square-wave pulse jumps from the voltage value of the positive DC control voltage signal to zero, the output voltage value of the reverse integrator increases in a constant rate from the negative voltage value of the positive DC control voltage signal to zero and a rising edge of the trapezoidal fire pulse is generated.

17. The method according to claim 12, wherein the step of modulating the positive and negative DC control voltage signals to corresponding square-wave pulses further comprises:
the amplitude of the output square-wave pulse is the voltage value of the positive DC control voltage or the voltage value of the negative DC control voltage when the pulse width control signal has a logic high level; and
the amplitude of the output square-wave pulse is zero when the pulse width control signal has a logic low level.

18. The method according to claim 12, further comprising linearly amplifying the pulse amplitude of the trapezoidal fire pulse M times, wherein M is an integer greater than 1.

19. A method for generating trapezoidal fire pulses, comprising:
determining voltage values of positive and negative DC control voltage signals according to pulse amplitude parameter values of positive and negative trapezoidal fire pulses required to be output;
determining a voltage value of fall-time DC control voltage signal according to a first fall time parameter value of the positive and negative trapezoidal fire pulses required to be output and the voltage value of the positive DC control voltage signal; or determining a voltage value of fall-time DC control voltage signal according to a second fall time parameter value of the positive and negative trapezoidal fire pulses required to be output and the voltage value of the negative DC control voltage signal;
determining a voltage value of a rise-time DC control voltage signal according to a rise time parameter value of the positive and negative trapezoidal fire pulses required to be output and the voltage values of the positive and negative DC control voltage signals;
generating a corresponding DC control voltage signal according to the determined voltage values of the negative and positive DC control voltage signals as well as the voltage values of the rise-time and fall-time DC control voltage signals,
modulating the positive and negative DC control voltage signals and the zero voltage signal to positive and negative square-wave pulses by using a first pulse width control signal and a second pulse width control signal which are both in a form of a square-wave or rectangular-wave pulse, wherein a falling edge of the first pulse width control signal coincides with a rising edge of the second pulse width control signal;

inputting the rise-time DC control voltage signal, the fall-time DC control voltage signal, and the positive and negative square-wave pulses to a reverse integrator with a feedback loop constituted by a dual differential amplifying circuit so as to generate positive and negative trapezoidal fire pulses and outputting the same.

20. The method according to claim 19, wherein the step of modulating the positive and negative DC control voltage signals as well as a zero voltage signal to positive and negative square-wave pulses further comprises:

when the first pulse width control signal has a logic high level, the amplitude of the output positive and negative square-wave pulses is the voltage value of the positive DC control voltage signal;

when the second pulse width control signal has a logic high level, the amplitude of the output positive and negative square-wave pulses is the voltage value of the negative DC control voltage signal; and when both the first and the second pulse width control signals have a logic low level, the amplitude of the output positive and negative square-wave pulses is zero.

21. The method according to claim 19, wherein the step of generating the trapezoidal fire pulses by the reverse integrator and output the same further comprises:

when the amplitude of the input positive and negative square-wave pulses is zero, the output of the reverse integrator is zero;

when the amplitude of the input positive and negative square-wave pulses jumps from zero to the voltage value of the positive DC control voltage signal, the output voltage value of the reverse integrator decreases in a constant rate from zero to a negative voltage value of the positive DC control voltage signal and a first falling edge of the positive and negative trapezoidal fire pulses is generated;

when the amplitude of the input positive and negative square-wave pulses is maintained to be the voltage value of the positive DC control voltage signal, the output of the reverse integrator is maintained to be the negative voltage value of the positive DC control voltage signal;

when the amplitude of the input square-wave pulses jumps from the voltage value of the positive DC control voltage signal to the voltage value of the negative DC control voltage signal, the output voltage value of the reverse integrator increases in a constant rate from the negative voltage value of the positive DC control voltage signal to the positive voltage value of the negative DC control voltage signal, and a rising edge of the positive and negative trapezoidal fire pulses is generated;

when the amplitude of the input positive and negative square-wave pulses is maintained to be the voltage value of the negative DC control voltage signal, the output of the reverse integrator is maintained to be the positive voltage value of the negative DC control voltage signal; and when the amplitude of the input positive and negative square-wave pulses jumps from the voltage value of the negative DC control voltage signal to zero, the output voltage value of the reverse integrator decreases in a constant rate from a positive voltage value of the negative DC control voltage signal to zero and a second falling edge of the positive and negative trapezoidal fire pulses is generated.

* * * * *